(12) United States Patent
Sugiura

(10) Patent No.: US 10,834,856 B2
(45) Date of Patent: Nov. 10, 2020

(54) ELECTRONIC CONTROL UNIT

(71) Applicant: DENSO CORPORATION, Kariya (JP)

(72) Inventor: Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/515,357

(22) Filed: Jul. 18, 2019

(65) Prior Publication Data

US 2020/0029471 A1    Jan. 23, 2020

(30) Foreign Application Priority Data

Jul. 23, 2018   (JP) .................... 2018-137565

(51) Int. Cl.
| | |
|---|---|
| H05K 1/02 | (2006.01) |
| H05K 7/20 | (2006.01) |
| H05K 1/11 | (2006.01) |
| H05K 3/34 | (2006.01) |
| H02K 11/33 | (2016.01) |
| B62D 5/04 | (2006.01) |
| H05K 3/42 | (2006.01) |
| H05K 1/18 | (2006.01) |

(52) U.S. Cl.
CPC ....... *H05K 7/20854* (2013.01); *B62D 5/0406* (2013.01); *B62D 5/0463* (2013.01); *H02K 11/33* (2016.01); *H05K 1/0206* (2013.01); *H05K 1/116* (2013.01); *H05K 1/184* (2013.01); *H05K 3/3447* (2013.01); *H05K 3/42* (2013.01); *H05K 2201/095* (2013.01)

(58) Field of Classification Search
CPC ............................ H05K 1/0206; H05K 1/184
See application file for complete search history.

(56) References Cited

U.S. PATENT DOCUMENTS

| | | | |
|---|---|---|---|
| 7,554,040 B2 * | 6/2009 | Nakao | B23K 1/085 174/260 |
| 2004/0108130 A1 | 6/2004 | Suzuki et al. | |
| 2007/0029108 A1 | 2/2007 | Nakao et al. | |
| 2011/0285223 A1 | 11/2011 | Miyachi et al. | |
| 2015/0156927 A1 | 6/2015 | Tsuboi | |
| 2016/0009314 A1 * | 1/2016 | Muramatsu | H02P 29/68 701/41 |
| 2017/0294860 A1 | 10/2017 | Yamasaki | |

FOREIGN PATENT DOCUMENTS

| | | |
|---|---|---|
| JP | 2003-243812 A | 8/2003 |
| JP | 2005-43090 A | 2/2005 |
| JP | 2007-042995 A | 2/2007 |
| JP | 2012-10576 A | 1/2012 |
| JP | 2015-106973 A | 6/2015 |
| JP | 2017-189034 A | 10/2017 |

* cited by examiner

*Primary Examiner* — Jeremy C Norris
(74) *Attorney, Agent, or Firm* — Maschoff Brennan

(57) ABSTRACT

An electronic control unit has a substrate that includes a terminal connection portion that is a through hole that extends through the substrate from a first surface to a second surface. A resist opening along an outer edge of the terminal connection portion exposes a circuit pattern from a surface resist layer. A plurality of vias are disposed at positions adjacent to the resist opening in a heat receiving area to facilitate the transfer of heat during a soldering process from the first surface to the second surface.

16 Claims, 15 Drawing Sheets

US 10,834,856 B2

ELECTRONIC CONTROL UNIT

CROSS REFERENCE TO RELATED APPLICATION

The present application is based on and claims the benefit of priority of Japanese Patent Application No. 2018-137565, filed on Jul. 23, 2018, the disclosure of which is incorporated herein by reference.

TECHNICAL FIELD

The present disclosure relates to an electronic control unit (ECU) and an electric power steering device using the ECU.

BACKGROUND INFORMATION

Drive devices such as an integrated motor-controller may include connector terminals for inputting and outputting signals to and from the drive device.

The connector terminals may be electrically connected to the substrate of an electronic control unit by a bonding process such as soldering. The substrate may have issues controlling the dissipation of heat during a soldering operation. As such, electronic control units are subject to improvement.

SUMMARY

The present disclosure describes an electronic control unit having a substrate that improves the heat dissipation from one surface of a substrate to another surface of the substrate during a soldering operation to improve the connectivity between a substrate and a terminal. The present disclosure also describes an electric power steering device using the electronic control unit.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
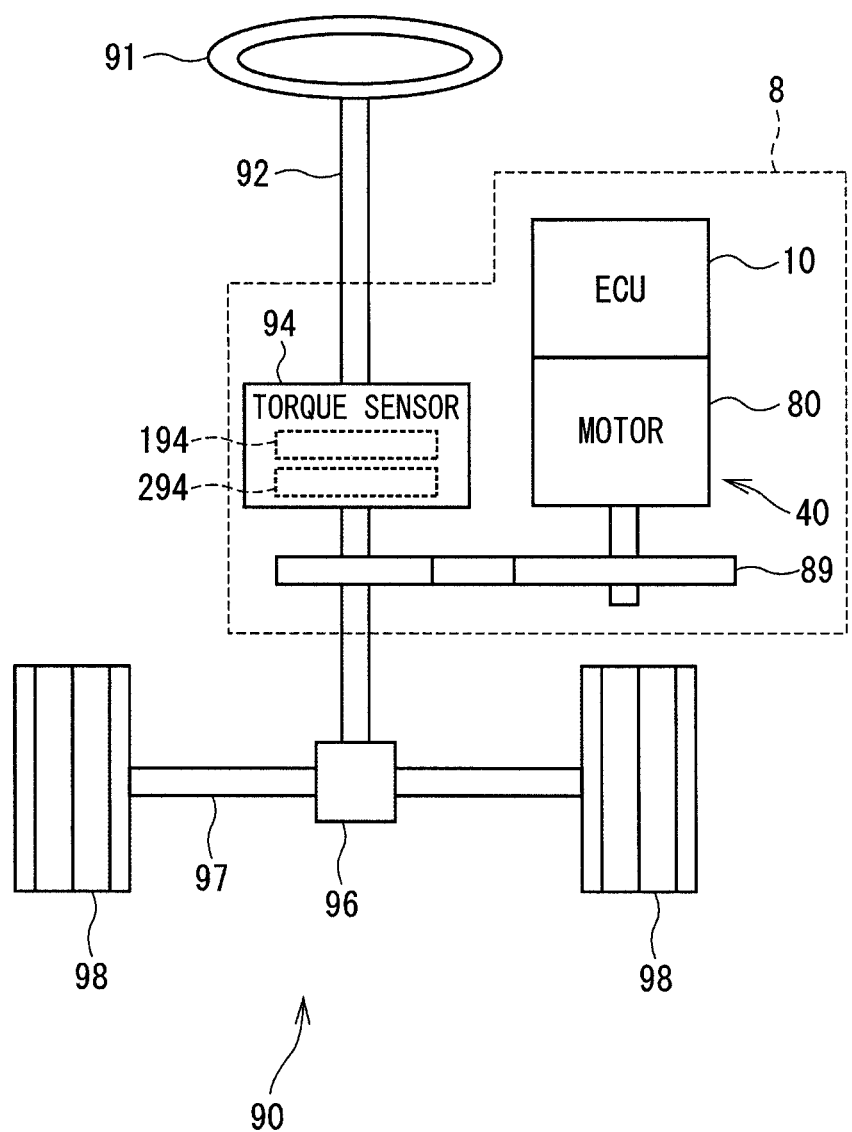
FIG. 1 illustrates a block diagram of a steering system in a first embodiment of the present disclosure.

Drive devices such as an integrated motor-controller may include connector terminals for inputting and outputting signals to and from the drive device.

When a terminal is connected to a substrate (e.g., printed circuit board) of an electronic control unit in the drive device by soldering the terminal to a surface of the substrate, the heat generated by the soldering process may not be transferred easily to another surface of the substrate. Such problems in heat transfer from one surface of the substrate to another may cause poor solderability and have an effect on the soldered connection of the terminal to the substrate.

The present disclosure describes an electronic control unit having a substrate that improves the heat dissipation from one surface of a substrate to another surface of the substrate to improve the connectivity between a substrate and a terminal. The present disclosure also describes an electric power steering device using the electronic control unit.

By forming the vias in the substrate, the vias can help assist the terminal connection portion in the transfer of heat during a soldering process from the first surface side of the substrate to the second surface side. The transfer of heat from one surface of the substrate to another improves the solderability of a terminal in the terminal connection portion to the substrate to provide a better soldered connection between the terminal and the substrate.

Various embodiments in the present disclosure are described with reference to the drawings. In the following embodiments, like features and elements among the embodiments may be referred to by the same reference numerals, and a repeat description of previously described like features and elements may be omitted from the descriptions of the latter embodiments.

First Embodiment

With reference to FIG. 1, an electronic control unit (ECU) 10 together with a motor 80 is included in an electric power steering device 8 to provide a powered assist (e.g., power steering) to assist a vehicle steering operation. FIG. 1 shows an overall configuration of a steering system 90 that includes the electric power steering device 8. The steering system 90 also includes a steering wheel 91, a steering shaft 92, a pinion gear 96, a rack shaft 97, and wheels 98, along with the electric power steering device 8.

The steering wheel 91 is connected to the steering shaft 92. The steering shaft 92 includes a torque sensor 94 for detecting a steering torque. The torque sensor 94 includes a first torque detection unit 194 and a second torque detection unit 294. The pinion gear 96 is disposed at one end of the steering shaft 92. The pinion gear 96 engages the rack shaft 97. Wheels 98 are connected to both ends of the rack shaft 97 via tie rods or a like mechanical linkage.

When the driver rotates the steering wheel 91, the steering shaft 92 connected to the steering wheel 91 is rotated. The rotational movement of the steering shaft 92 is converted by the pinion gear 96 into linear movement to move the rack shaft 97 in a linear manner. The pair of wheels 98 is steered at an angle corresponding to the displacement amount of the rack shaft 97.

The electric power steering device 8 includes a drive device 40 having the motor 80, the ECU 10, and a speed reduction gear 89. The speed reduction gear 89 is a power transmission unit that decelerates the rotation of the motor 80 and transmits the rotation to the steering shaft 92. In the present embodiment, the electric power steering device 8 may be, for example, a "column assist type" electric power steering device. However, the electric power steering device 8 may also be a "rack assist type" electric power steering device that transmits the rotation of the motor 80 to the rack shaft 97.

Figure 2:
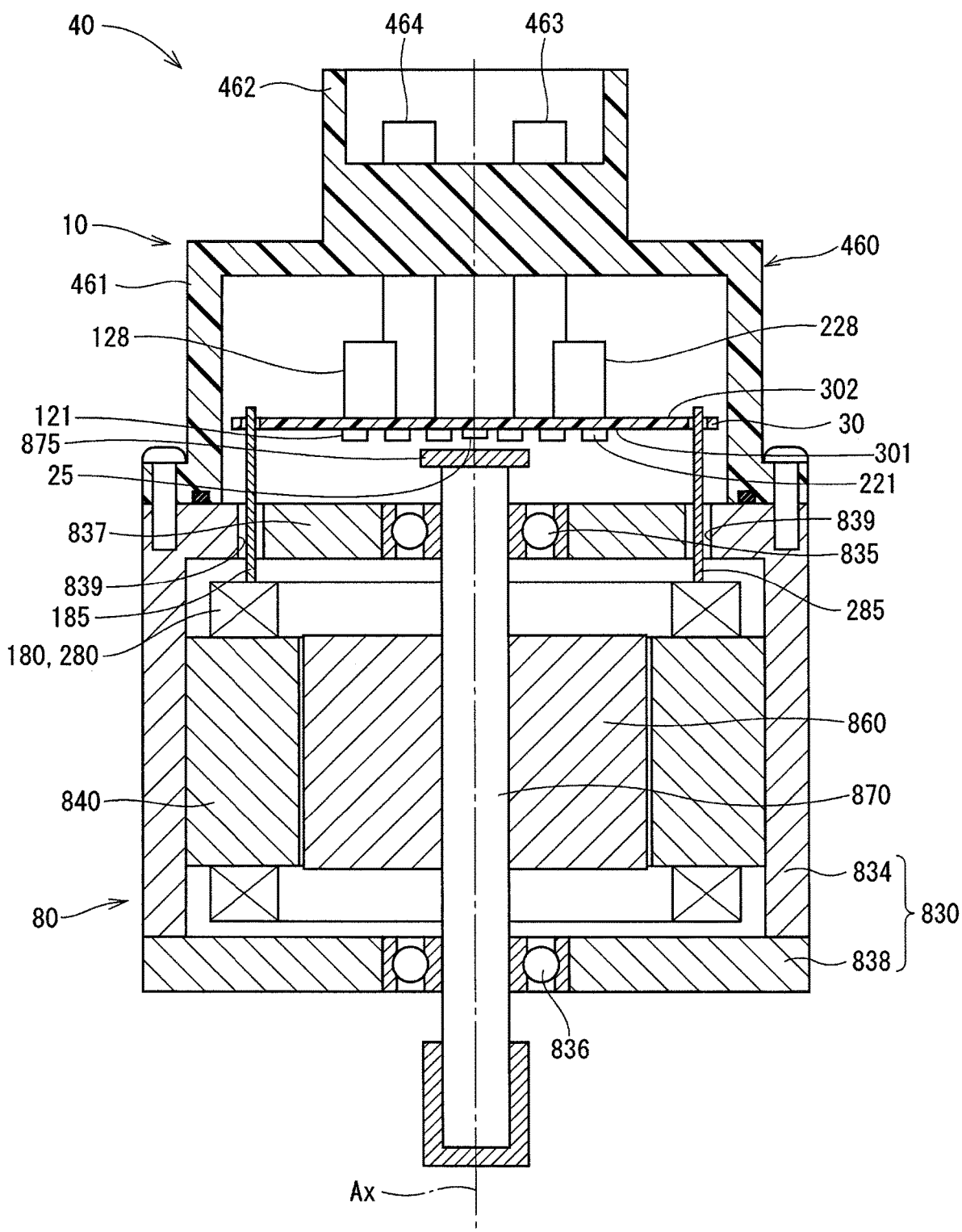
FIG. 2 illustrates a cross-sectional view of a drive device in the first embodiment.

As shown in FIG. 2, the motor 80 outputs a portion or all of the torque for steering and is driven by power supplied from a battery (not shown) to rotate the reduction gear 89 back and forth. The motor 80 may be, for example, a three-phase brushless motor having a rotor 860 and a stator 840.

The motor 80 has a first motor winding 180 and a second motor winding 280. The first motor winding 180 may be a first winding set, for example, with windings corresponding to each of the three phases (e.g., a U-phase, a V-phase, and a W-phase). Similarly, the second motor winding 280 may be a second winding set. The motor windings 180 and 280 have the same electrical characteristics and are cancel-wounded on the common stator 840 with their electrical angles shifted from each other by 30 degrees. In response to such a configuration, the motor windings 180 and 280 are respectively controlled to receive a supply of a phase current having a phase shift of 30 degrees between the phases. By optimizing the phase difference of the supply current, the output torque can be improved. The sixth harmonic (e.g., the sixth harmonic distortion) in the torque ripple can also be reduced by optimizing the phase difference. Since the electric current is averaged by the phase difference supply, the amount of electrical noise and vibration that can be cancelled is maximized. Since heat generation is also averaged, the temperature dependent intersystem errors that occur in the detection values of the sensors (e.g., torque values detected by torque sensors) can be reduced, and the amount of electric current that can be supplied is also averaged.

A combination of devices related to the drive control of the motor 80 by the first motor winding 180 is referred to as a first system, and a combination of devices related to the drive control of the motor 80 by the second motor winding 280 is referred to as a second system. The devices related to the first system are mainly numbered in the 100s (i.e., with a "1" as a prefix or as the most significant digit) and the devices related to the second system are mainly numbered in the 200s. In the first system and the second system, like features, elements, and configurations may be numbered with the same numbers (e.g., the least significant digits being the same number). For example, the first motor winding is 180, where the "1" in 180 indicates the first motor winding 180 is in the first system. The second motor winding is 280, where "2" in 280 indicates the second motor winding 280 is in the second system. Both the first motor winding 180 and the second motor winding 280 have "80" as the least significant digits, indicating a substantially similar or like feature, element, or configuration.

The drive device 40 may integrate the ECU 10 together with the motor 80 in one integral package as a "machine-controller integrated type" drive device 40. The ECU 10 may be disposed "axially" on one end of the motor 80. That is, the ECU 10 may be disposed at one end of the motor 80 in the direction of the longitudinal axis Ax. While the ECU 10 and the motor 80 are described here as being integral, the motor 80 and the ECU 10 may be separately disposed. The ECU 10 is disposed coaxially with the axis Ax of a shaft 870 on one side of the motor 80 and opposite to the output shaft of the motor 80. However, the ECU 10 may be disposed on the output shaft side of the motor 80. By adopting the machine-controller integrated type configuration, the ECU 10 and the motor 80 can be efficiently arranged and mounted in a vehicle with a limited amount of mounting space.

The motor 80 includes the stator 840, the rotor 860, and a housing 830. The housing 830 accommodates both the rotor 860 and the stator 840 along with other components. The stator 840 is fixed to the housing 830, and the motor windings 180 and 280 are wound on the stator 840. The rotor 860 is disposed on the radial inside of the stator 840 (i.e., the rotor is disposed closer to the shaft 870 than the stator 840). The rotor 860 rotates relative to the stator 840.

The shaft 870 is inserted into the rotor 860 to form an integral assembly, and the shaft 870 rotates integrally with the rotor 860. The shaft 870 is rotatably supported by the bearings 835 and 836 in the housing 830. An end of the shaft 870 on the ECU 10 side protrudes from the housing 830 toward the ECU 10. A magnet 875 is disposed on the end of the shaft 870 on the ECU 10 side. The magnet 875 rotates with the shaft 870 and may be used as a detection target (e.g., to detect the rotation of the shaft 870 and rotor 860).

The housing 830 has a closed bottom cylindrical case 834 that includes a rear frame end 837 as the bottom. The open side of the case 834 is covered by a front frame end 838. The case 834 and the front frame end 838 are fastened to each other by bolts or like fasteners. Lead wire insertion holes 839 are formed through the rear frame end 837. The lead wires 185 and 285 are connected to the respective phases of the motor windings 180 and 280 and are inserted through the lead wire insertion holes 839. The lead wires 185 and 285 extend out of the lead wire insertion holes 839 and toward the ECU 10 and are connected to a substrate 30.

The ECU 10 includes a cover 460, the substrate 30, and various electronic components mounted on the substrate 30.

The cover 460 protects the electronic components from external impact, and prevents the ingress of dust, water, and like contaminants into the inside of the ECU 10. The cover 460 includes a cover body 461 and a connector portion 462.

The cover body 461 and the connector portion 462 may be integrally formed, such that the cover 460 is a one piece construction. Alternatively, the connector portion 462 may be separately disposed from the cover body 461.

The connector portion 462 is disposed at an axial end of the drive device 40 (e.g., along the axis Ax). The connector portion 462 has an opening that faces away from the motor 80. The connector portion 462 includes a power supply terminal 463 and a ground terminal 464. The end of the power supply terminal 463 on the connector portion 462 connects to a power supply (not shown). The end of the ground terminal on the connector portion 462 connects to ground or a power return path (not shown). The other ends of the power supply terminal 463 and the ground terminal 464 are connected to the substrate 30. The power supply terminal 463 and the ground terminal 464 may also be referred to as the outermost terminals 463 and 464.

Although not shown in FIG. 2, the connector portion 462 may additionally include a control terminal including a vehicle communication terminal to connect the drive device to a vehicle communications systems and a torque terminal to connect the drive device 40 to the torque sensor 94. The control terminal and the torque terminal may be integrally formed in the connector portion 462 or may be separate parts from the connector portion 462. The number of connectors and the number of terminals may be arbitrarily changed, for example, based on the number of input/output signals to/from the drive device 40.

The substrate 30 may be, for example, a printed circuit board (PCB). The substrate 30 has one main side (i.e., main face/main surface) facing the rear frame end 837 and one main side facing the connector portion 462. The facing directions of the main surfaces of the substrate 30 may also be described relative to the motor 80, for example, as facing the motor 80 or facing away from the motor 80.

Figure 7:
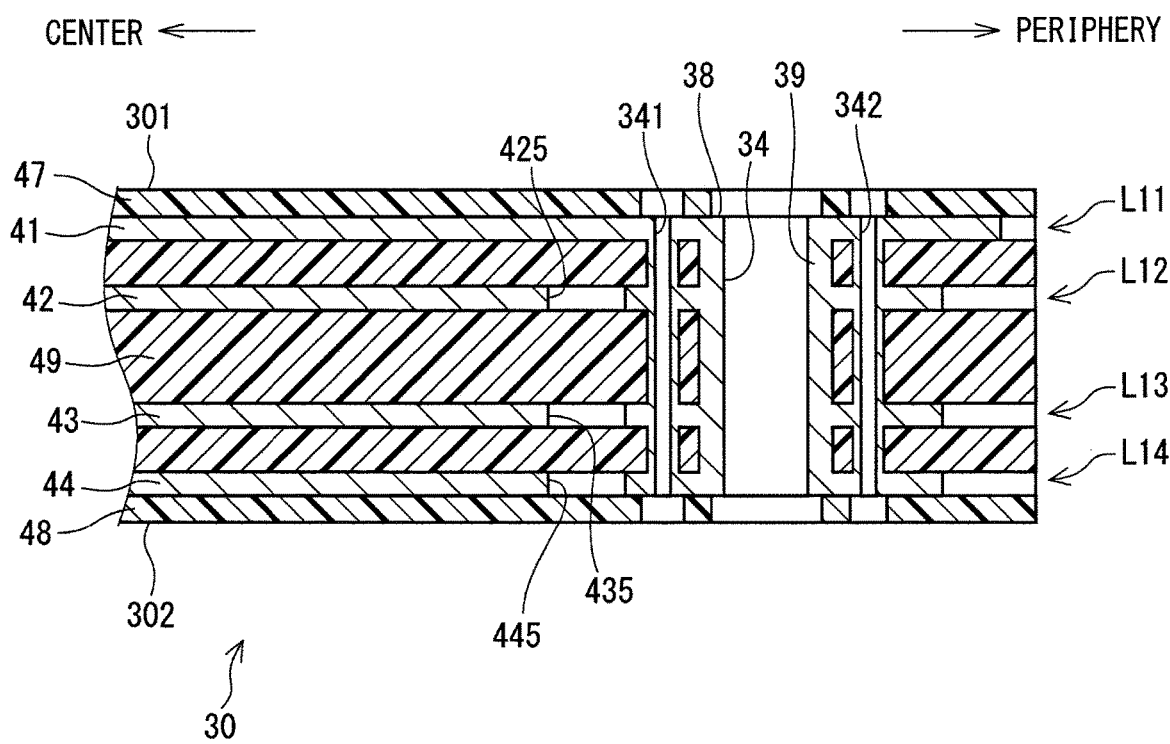
FIG. 7 illustrates a cross-sectional view of the substrate and ground terminal taken along line VII-VII in FIG. 5.

As shown in FIG. 7, the substrate 30 may be a four layer substrate having multilayer through holes (e.g., through hole vias) bored through one or more of the layers to electrically connect circuits on different layers. In the present embodiment, since the power supply terminal 463 and the ground terminal 464 are inserted into through holes on the substrate 30 on the side of the substrate 30 opposite the motor 80, the tips of the power supply terminal 463 and the ground terminal 464 project toward the motor 80. As such, soldering work to solder the tips of the power supply terminal 463 and the ground terminal 464 to the substrate 30 is performed on the side of the substrate 30 that faces the motor 80 (i.e., on the motor facing side of the substrate 30). Solder may be used to attach electrical components to the substrate 30 and form an electrical connection between such electrical components and the substrate 30. As such, solder may also be referred to as a connection member.

Among the two main surfaces of the substrate 30, the surface facing the motor 80 (i.e., the motor side surface) on which the soldering work is performed is referred to as a first surface 301, and the other surface opposite the motor 80, that is, the surface facing away from the motor 80, is referred to as a second surface 302. The layers of the substrate 30 are referred to as a first layer L11, a second layer L12, a third layer L13, and a fourth layer L14. The layers are arranged in ascending order from the first surface 301 with the first layer L11 disposed closest to the motor 80. A first circuit pattern 41 is formed on the first layer L11, a second circuit pattern 42 is formed on the second layer L12, a third circuit pattern 43 is formed on the third layer L13, and a fourth circuit pattern 44 is formed on the fourth layer L14. An interlayer insulating layer 49 is formed between the circuit patterns 41, 42, 43, and 44 (i.e., 41-44). A surface resist layer 47 is formed on the first surface 301, and a surface resist layer 48 is formed on the second surface 302.

Figure 3:
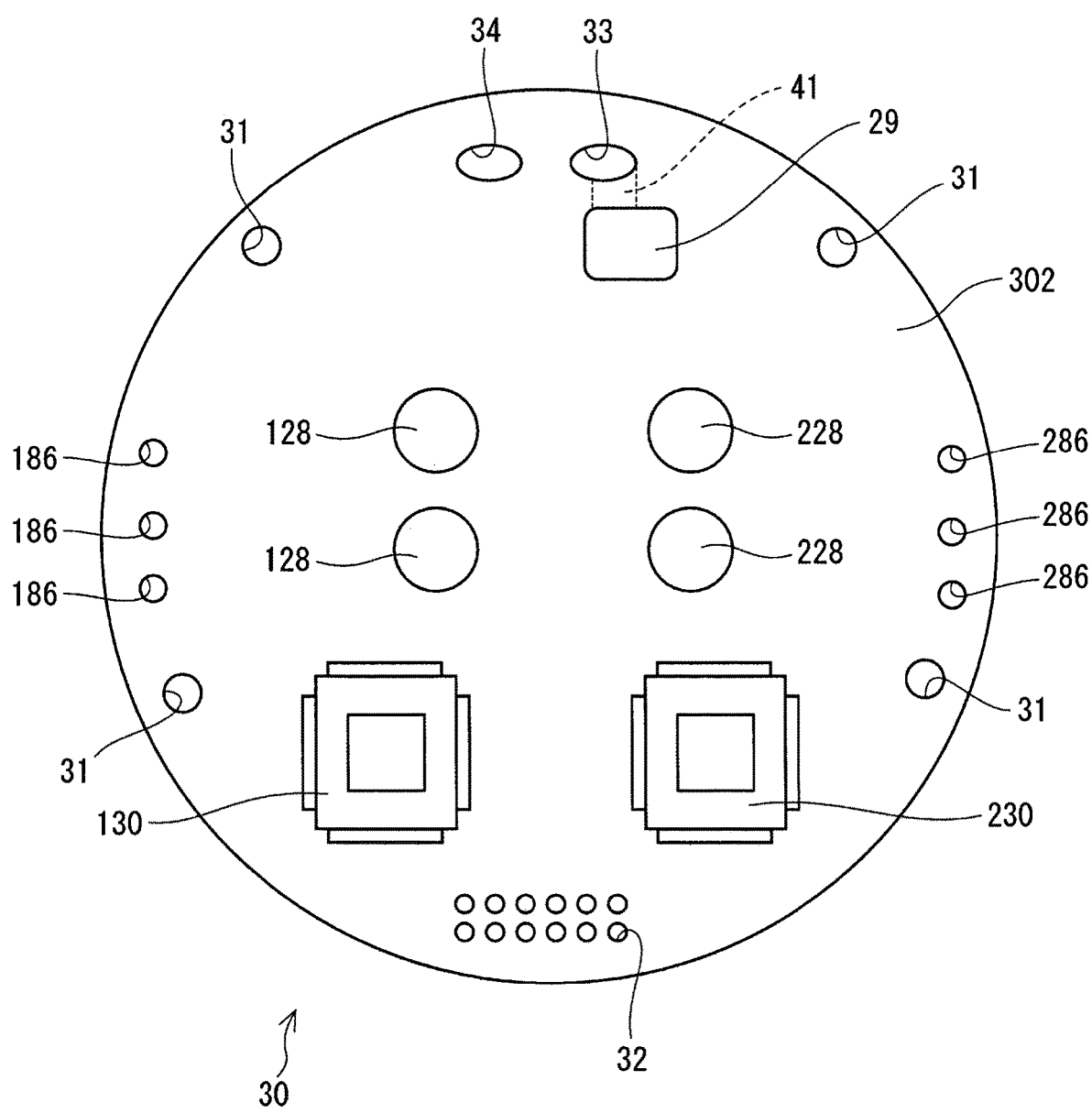
FIG. 3 illustrates a plan view of a first surface side of a substrate in the first embodiment.

As shown in FIGS. 2 and 3, switching elements 121 and 221, a rotation angle sensor 25, and a custom integrated circuit (IC) (not shown) that form a drive circuit are mounted on the first surface 301 of the substrate 30. The rotation angle sensor 25 is mounted at a position facing the magnet 875 so as to detect changes in the magnetic field caused by the rotation of the magnet 875.

As shown in FIG. 3, capacitors 128 and 228, a coil 29, and computers 130 and 230 are mounted on the second surface 302 of the substrate 30. The computer 130 and 230 may be small computers (i.e., microcomputers) such as microcontrollers or systems on a chip (SoCs). The capacitors 128 and 228 smooth the electric power input from a battery (not shown). The capacitors 128 and 228 also assist the power supply to the motor 80 by storing electric charge. The capacitors 128 and 228 and the coil 29 form a filter circuit to reduce electric noise transmitted to/from other devices sharing the battery with the drive device 40. A power supply relay, a motor relay, and a current sensor, among other electrical components (all not shown) may also be mounted on the first surface 301 or on the second surface 302. In the present embodiment, the electronic components are mounted on one single substrate 30. However, the electronic components may be mounted on two or more substrates.

A substrate fixing portion 31, motor wire connection portions 186 and 286, a control terminal connection portion 32, a power supply terminal connection portion 33, and a ground terminal connection portion 34 are formed on the substrate 30. The substrate fixing portion 31, the motor wire connection portions 186 and 286, the control terminal connection portion 32, the power terminal connection portion 33, and the ground terminal connection portion 34 are all disposed in a periphery area near an outer edge/periphery of the substrate 30. By disposing the substrate fixing portion 31, the motor wire connection portions 186 and 286, the control terminal connection portion 32, the power terminal connection portion 33 near the periphery, more space can be provided/reserved toward the center of the substrate (e.g., away from the periphery) as a mounting space for mounting electrical components. The substrate fixing portion 31, the motor wire connection portions 186 and 286, the control terminal connection portion 32, the power supply terminal connection portion 33, and the ground terminal connection portion 34 are through holes that extend through the substrate 30 to establish an electrical connection between the first surface 301 and the second surface 302. The inner walls of the through holes are plated with a conductive material such as copper to form a through hole land/through hole barrel. The through hold land may refer to the plated portions of the through hole closer to the first surface 301 and the second surface 302, while the through hole barrel may refer to the centrally disposed plated portions in the middle of the substrate 30. For ease of the description, the through hole land may refer to the plated portions anywhere on the through hole, regardless of location, and include the land portion and the barrel portion. The inner wall of the substrate fixing portion 31 may be not plated.

A screw or a like connector (not illustrated) is inserted into the substrate fixing portion 31 to fix the substrate 30 to the rear frame end 837.

The lead wires 185 are inserted into the motor wire connection portions 186 and may be electrically connected to the motor wire connection portions by solder or a like bonding material/process. Similarly, the lead wires 285 are inserted into and soldered to the motor wire connection portions 286. The control terminal is inserted into the control terminal connection portion 32, and is electrically connected to the control terminal connection portion 32 by solder or a like bonding material/connection member.

Figure 4:
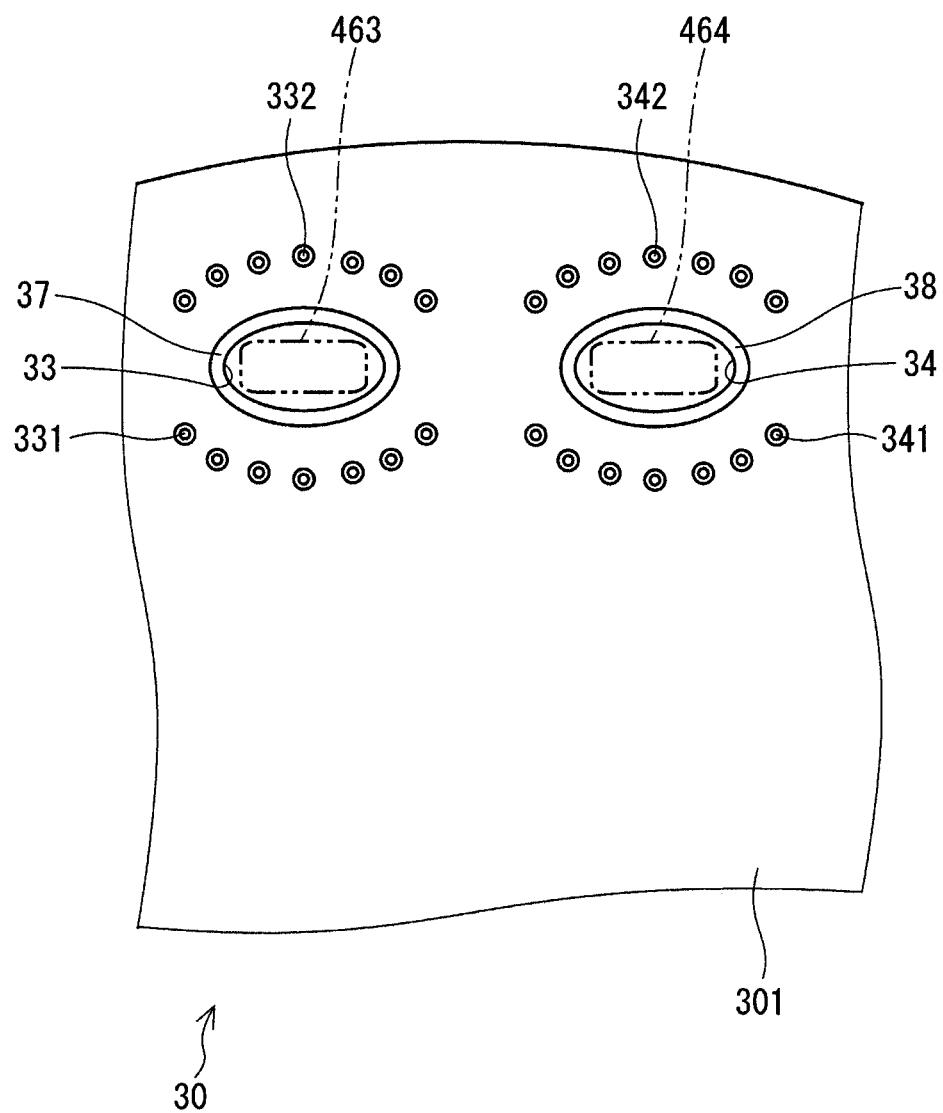
FIG. 4 illustrates a plan view of a power supply terminal connection portion and a ground terminal connection portion in the first embodiment.
Figure 5:
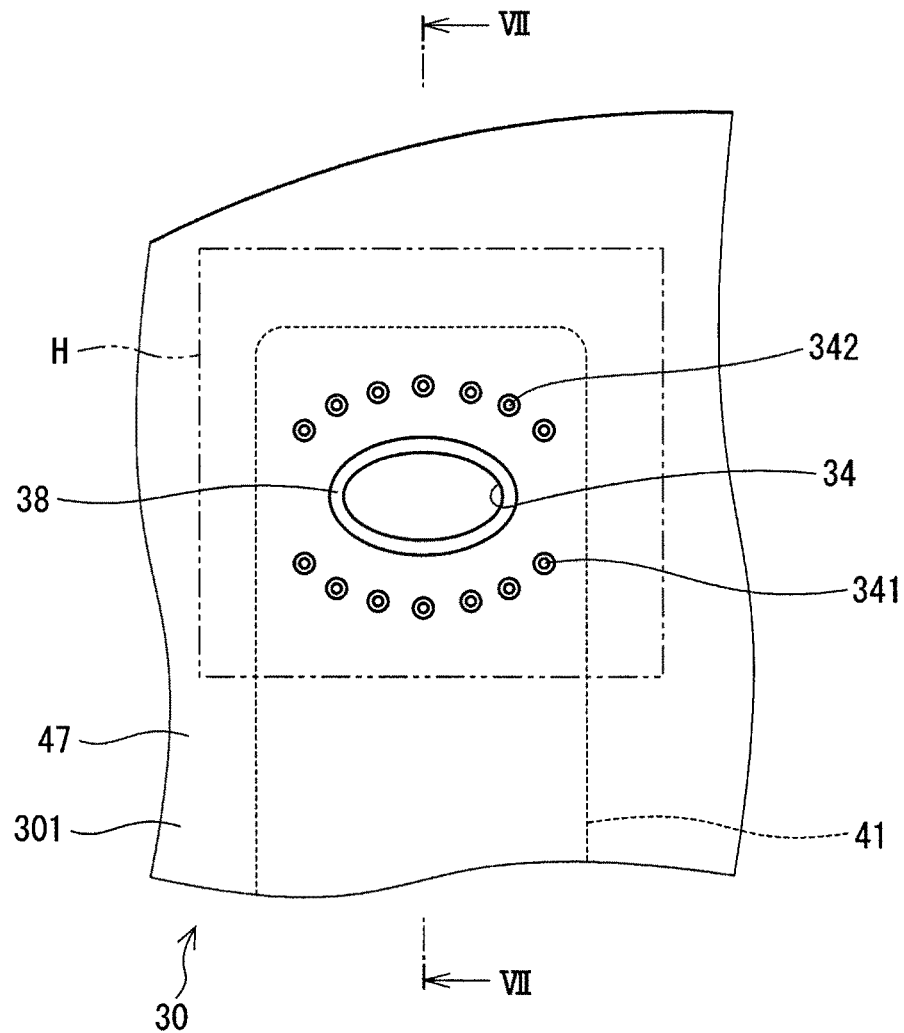
FIG. 5 illustrates a plan view of the ground terminal connection portion according in the first embodiment.

As shown in FIG. 4, the power supply terminal 463 is inserted into the power supply terminal connection portion 33 and electrically connected to the power supply terminal connection portion 33 by solder or a like bonding material/connection member. The ground terminal 464 is inserted into the ground terminal connection portion 34 and electrically connected to the ground terminal connection portion 34 by solder or a like bonding material/connection member. The through hole land is formed on an inner wall surface of the power supply terminal connection portion 33. A part of the through hole land on the first surface 301 side is exposed from the surface resist layer 47 and referred to as a resist opening 37. A through hole land 39 shown in FIG. 7 is formed on the inner wall surface of the ground terminal connection portion 34. A part of the through hole land 39 on the first surface 301 side is exposed from the surface resist layer 47 and referred to as a resist opening 38, as shown in FIGS. 4 and 5. The through hole land is connected to the circuit pattern of each layer and can be considered as a part of the circuit pattern.

The power supply terminal connection portion 33 and the ground terminal connection portion 34 each have a substantially elliptical shape, as shown in the plan views in FIGS. 3 and 4. The short sides of the power supply terminal connection portion 33 and the ground terminal connection portion 34 are disposed adjacent to one another. Assuming an elliptical shape of the terminal connection portions 33 and 34, the short side here refers to the side areas of the ellipse around the vertices on the major axis (i.e., the sides near the ends of the long axis of the ellipse).

The coil 29, as shown in FIG. 3, is mounted at a position close to the power terminal connection portion 33. The coil 29 is disposed radially inward of the power terminal connection portion 33 (i.e., at a position closer to the center of the substrate 30). The power supply terminal connection portion 33 and the coil 29 are connected by a wide circuit pattern that has a width greater than half of the power supply terminal connection portion 33.

The power supply terminal connection portion 33 has a circuit pattern with a width that is greater than half the length of the long side of the power supply terminal connection portion 33 (e.g., greater than half the width of the major axis of the power supply terminal connection portion). For example, the circuit pattern may have a width of 2 mm or more. As such, when the power supply terminal 463 and the power supply terminal connection portion 33 are connected by soldering, the heat can be easily dissipated by the circuit pattern and the heat from the soldering process is not readily transmitted to the second surface 302 of the substrate 30, which may affect the solderability of the power supply terminal 463 to the power supply terminal connection portion 33. On the other hand, in instances where the terminal is narrow, for example, a control terminal where the terminal is a thin wire and where the circuit pattern connected to the connection portion is narrow (not shown), the heat from the soldering process is not so easily dissipated toward the circuit pattern and thus not easily dissipated by the circuit pattern. As such, the heat from a soldering operation that solders the control terminal to the control terminal connection portion may be better transferred from the first surface 301 to the second surface 302 to improve the solderability of the control terminal to the substrate 30. Consequently, when the power supply terminal 463 and the substrate 30 are soldered, the heat from soldering may be dissipated through the wide circuit pattern and the solderability of the power supply terminal 463 to the substrate 30 may be worse than the solderability of the control terminal to the substrate 30. The same applies to the ground terminal 464 as the power supply terminal 463 in terms of soldering, that is, connection to a wide circuit pattern may affect the solderability of the ground terminal 464 to the substrate 30.

In the present embodiment, the terminal connection portions 33 and 34 are arranged side by side with the short sides of the terminal connection portions 33 and 34 adjacent to each other. In this arrangement, the heat is more easily dissipated compared to an arrangement where the long sides of the terminal connection portions 33 and 34 are adjacent to each other. The power supply terminal 463 is disposed relatively close to the coil 29. The coil 29 is a relatively large component having a large heat capacity, and as such, there may be problems with heat from a soldering operation being dissipated to the coil 29. While the solderability of objects to the substrate 30 may be improved by warming the soldering objects before soldering, such a practice may cause damage to the substrate 30 and the elements mounted on the substrate 30, increase the energy used for soldering, increase the manufacturing time, and cause other problems.

In the present embodiment, as shown in FIGS. 4 and 5, vias 331 and 332 are disposed outside of and adjacent to the resist opening 37 so as to surround the power supply terminal connection portion 33. Similarly, vias 341 and 342 are disposed outside of and adjacent to the resist opening 38 so as to surround the ground terminal connection portion 34. In the present embodiment, the vias 331, 332, 341, and 342 are arranged along the outer edges of the resist openings 37 and 38.

The vias 331 and 332 are connected by a circuit pattern to the through hole land/barrel formed in the power supply terminal connection portion 33, and the vias 331 and 332 have the same potential as the power supply terminal connection portion 33. The vias 341 and 342 are connected by a circuit pattern to the through hole land/barrel 39 formed in the ground terminal connection portion 34, and the vias 341 and 342 have the same potential as the ground terminal connection portion 34.

The inner vias 331 and 341 are formed and disposed closer to a center of the substrate 30 than the terminal connection portions 33 and 34. The outer vias 332 and 342 are formed and disposed closer to the periphery of the substrate 30 than the terminal connections 33 and 34. The functions of the inner vias 331 and 341 are the same, and the functions of the outer vias 332 and 342 are the same. As such, the following description is focused on the vias 341 and 342 formed around the ground terminal connection portion 34.

Figure 6:
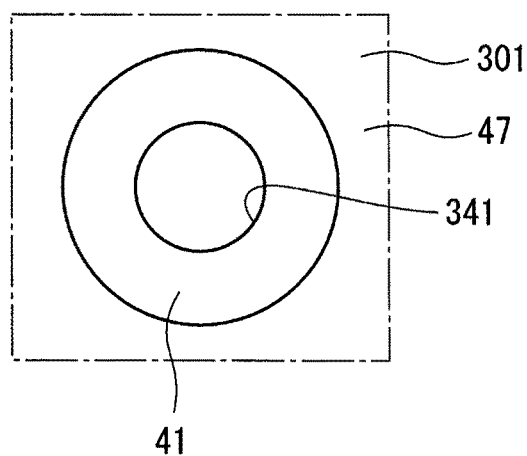
FIG. 6 illustrates a plan view of a via in the first embodiment.

As shown in FIGS. 5 and 6, the vias 341 and 342 are formed in a heat receiving area H. The heat receiving area H is an area in contact with the solder at the time of soldering. Since the substrate 30 of the present embodiment is a through-hole substrate, the vias 341 and 342 are through holes that extend through the entirety of the substrate 30 to connect the first surface 301 and the second surface 302. That is, the through hole vias 341 and 342 pierce the first surface 301, extend through the substrate 30, and pierce the second surface 302 to form a through via extending through the substrate 30.

FIG. 6 shows one inner via 341. Since the inner via 341 is a through hole, the surface resist layer 47 cannot be formed on the surface of the inner via 341. As a result, the first circuit pattern 41 of the first layer L11 is exposed around the inner via 341. The circuit pattern around the outer via 342 is configured in a like manner. As shown, for example, in FIG. 5, the surface resist layer 47 is formed at a position between the vias 341 and 342 and the resist opening 38 on the first surface 301. In other words, the vias 341 and 342 and the resist opening 37 do not form a continuous area and have the surface resist layer 47 interposed between them to separate the vias 341 and 342 and the resist opening 37.

The heat receiving area H is indicated by a two-dot-one-dash line in FIG. 6. The heat receiving area H is an area in contact with the solder when the ground terminal 464 and the substrate 30 are connected. At the time of soldering, in order to produce a solder back fillet, heat is transferred to the second surface 302. As such, in the present embodiment, as shown in FIG. 5 and FIG. 7, the circuit pattern 41 on the first surface 301, i.e., the soldering surface, is spread wide to better receive the heat from soldering and to assist with the heat dissipation to the second surface 302 (i.e., the non-soldering surface). The inner via 341 also functions as a barrier to limit and/or prevent the heat on the first surface 301 from dissipating toward the center of the first surface 301 of the substrate 30 to better maintain the heat around the ground terminal connection portion 34 and direct the transfer of heat from the first surface 301 to the second surface 302. As indicated near the top of FIG. 7, the right side of FIG. 7 is a direction extending toward the periphery of the substrate 30, and the left side is a direction extending toward the center of the substrate 30.

As shown in FIG. 7, the radial dimensions of the circuit patterns 42, 43, and 44 can be made smaller than radial dimension of the circuit pattern 41 in an outer area on the periphery side of the outer via 342 that extends toward the periphery. By making the circuit patterns 42, 43, and 44 formed respectively on the layers L12, L13, and L14 as small as possible in the outer area (i.e., on the periphery side), heat dissipation toward the periphery of the substrate 30 can be limited and/or prevented. Such a configuration may be used to improve the solder rise during a soldering operation and is especially beneficial if the solder rise is poor.

In an area that is radially closer to the center of the substrate than the inner via 341, the circuit patterns 42, 43, and 44 formed respectively on layers L12, L13, and L14 respectively include separators 425, 435, and 445 for separating part of each respective pattern 42, 43, and 44 connected to the center of the substrate 30 from the parts of each respective pattern connected to the ground terminal connection portion 34. The separators 425, 435, and 445 limit and/or prevent heat from dissipating radially toward the center of the substrate 30 to better maintain the heat around the ground terminal connection portion 34 and improve the heat transfer from the first surface 301 to the second surface 302 during a soldering operation.

As described above, the ECU 10 in the present embodiment includes the substrate 30, the power supply terminal 463 and the ground terminal 464. The substrate 30 has the circuit patterns 41-44, the surface resist layer 47, the terminal connection portions 33 and 34, the resist openings 37 and 38, and the plurality of vias 331, 332, 341, and 342. The circuit patterns 41-44 are layered as the first to n-th layers, where n is an integer of 2 or more. In the present embodiment, there are four layers of circuit patterns (i.e., n=4). The surface resist layer 47 is provided on the first layer L11. The terminal connection portions 33 and 34 are through holes that penetrate the first surface 301 on the first layer L11, extend through the substrate 30, and penetrate the second surface 302 on the fourth layer L14, in this case, the n-th layer. The resist openings 37 and 38 expose the circuit pattern from the surface resist layer 47 along the outer edges of the terminal connection portions 33 and 34. The vias 331, 332, 341, and 342 are disposed at positions outside of the resist openings 37 and 38.

The power supply terminal 463 is inserted into the power supply terminal connection portion 33 near an outermost periphery of the substrate 30 and electrically connected to the substrate 30 by soldering.

The ground terminal 464 is inserted into the ground terminal connection portion 34 near an outermost periphery of the substrate 30 and electrically connected to the substrate 30 by soldering. The outermost terminal of the present embodiment is the power supply terminal 463 connected to a power supply (not shown) and the ground terminal 464 connected to ground or power return path (not shown). On the substrate 30, no other terminal is disposed on the outside of the power supply terminal 463 and the ground terminal 464, i.e., at positions closer to the periphery of the substrate 30 than the terminals 463 and 464. As such, the terminals 463 and 464 are considered to be the "outermost terminals."

The vias include a plurality of outer vias 332 that are formed and disposed in the heat receiving area H. The heat receiving area H receives the heat from soldering when the power supply terminal 463 is soldered to the substrate 30. The outer vias 332 are formed/disposed closer to the periphery of the substrate 30 than the resist opening 37.

The vias also include a plurality of outer vias 342 that are formed/disposed in the heat receiving area H. The heat receiving area H receives the heat from soldering when the ground terminal 464 is soldered to the substrate 30, where the outer vias 342 are formed/disposed closer to the periphery of the substrate 30 than the resist opening 38.

The heat receiving area H is an area that is in contact with the solder during the soldering. The vias 331, 332, 341, and 342 are formed/disposed in the heat receiving area H to receive the heat from the first surface 301, that is, the surface 301 of the substrate 30 being soldered (i.e., the soldering surface). The terminal connection portions 33 and 34 can facilitate heat dissipation away from the first surface 301 to the second surface 302. The vias 331, 332, 341, and 342 can also maintain heat around the terminal connection portions 33 and 34—that is, by limiting and/or preventing heat from either being dissipated via the circuit patterns toward the center of the substrate 30, or toward the periphery of the substrate 30. By configuring the substrate 30 to dissipate and manage the heat from soldering in such manner, the soldering of electrical components to the substrate 30 is improved and thus, the connectivity between the substrate 30 and the terminals 463 and 464 is improved. In particular, when a wide width terminal such as the power terminal 463 or the ground terminal 464 is connected to a relatively wide circuit pattern, or when a component having a large thermal capacity is mounted close to such wide width terminals, heat tends to dissipate toward such circuit patterns or components with large thermal capacities. As such, by including the vias 331, 332, 341 and 342 to assist with the heat dissipation and heat control, the heat dissipation can be better controlled and the solderability of components to the substrate 30 can be improved.

The vias include the plurality of outer vias 332 and 342 and the plurality of inner vias 331 and 341 that are formed closer to the center of the substrate 30 than the outer vias 332 and 342. Similar to the outer vias 332 and 342, the inner vias 331 and 341 assist in transferring heat from the first surface 301 to the second surface 302. The inner vias 331 and 341 also function as barriers to limit and/or prevent the radially dissipation of heat via the circuit patterns toward the center of the substrate 30. By controlling the dissipation of heat in such manner, the solderability of components to the substrate 30 can be improved.

The vias 331, 332, 341, and 342 are through hole vias that pierce both the first surface 301 and the second surface 302 and extend through the layers of the substrate 30. The surface resist layer 47 is formed between the vias 331, 332, 341, and 342 and the resist openings 37 and 38 on the first surface 301. In the present embodiment, since the vias 331 and 332 and the power supply terminal connection portion 33 are connected by a circuit pattern, the expansion of the resist opening 37 can be limited and/or prevented by covering the connection circuit pattern with a resist. Similarly, since the vias 341 and 342 and the ground terminal connection portion 34 are connected by a circuit pattern, the expansion of the resist opening 38 can be limited and/or prevented by covering the connection circuit pattern with a resist.

The circuit patterns formed at positions closer to the center of the substrate 30 than the terminal connection portions 33 and 34 include the separators 425, 435, and 445 to separate the circuit patterns connected to the terminal connection portions 33 and 34 from the circuit patterns extending toward the center of the substrate 30. In the present embodiment, the separators 425, 435 and 445 are respectively formed in, i.e., disposed, in the circuit patterns 42, 43, and 44, that is, in the circuit patterns other than the first circuit pattern 41. By including such separators 425, 435, and 445 in the circuit patterns, the radial heat dissipation away from the connection terminals 33 and 34 and to such circuit pattern extending toward the center of the substrate 30 can be reduced and/or eliminated (i.e., suppressed) to improve the heat transfer from the first surface 301 to the second surface 302.

The electric power steering device 8 includes the ECU 10 and the motor 80. The electric power steering device 8 has power terminals such as the power supply terminal 463 and the ground terminal 464 both of which can handle large electric currents. Because large currents may be supplied to the terminals 463 and 464, the terminals 463 and 464 are configured to have a wider width than other terminals and are connected to wider circuit patterns having larger areas in the substrate 30. However, such large circuit patterns may allow the heat from a soldering operation to be dissipated through the circuit pattern and this may cause problems in the soldering operation. As such, by forming the vias 331, 332, 341, and 342, the heat from the soldering process can be better maintained around the terminal connection portions 33 and 34. The heat can also be better dissipated from the first surface 301 to the second surface 302 via the vias 331, 332, 341, and 342 in connection with the terminal connection portions 33 and 34, while limiting and/or preventing heat dissipation to the circuit patterns. By controlling the heat dissipation in such manner, the solderability of electrical components to the substrate 30 can be improved.

Second Embodiment

The second embodiment of the present disclosure is described with reference to FIGS. 8, 9, and 10. In the present embodiment, the ground terminal connection portion 34 and the vias 341 and 342 are mainly described, with a focus on the circuit patterns 42, 43, and 44 that are respectively in the second layer L12, the third layer L13, and the fourth layer L14. The power supply terminal connection portion 33 and the vias 331 and 332, as described with reference to the first embodiment, are substantially the same in the second embodiment, and thus a repeated description of these features in the second embodiment is omitted. In the subsequent embodiments, like features and elements previously described in the prior embodiments may be omitted from the descriptions of the latter embodiments.

Figure 8:
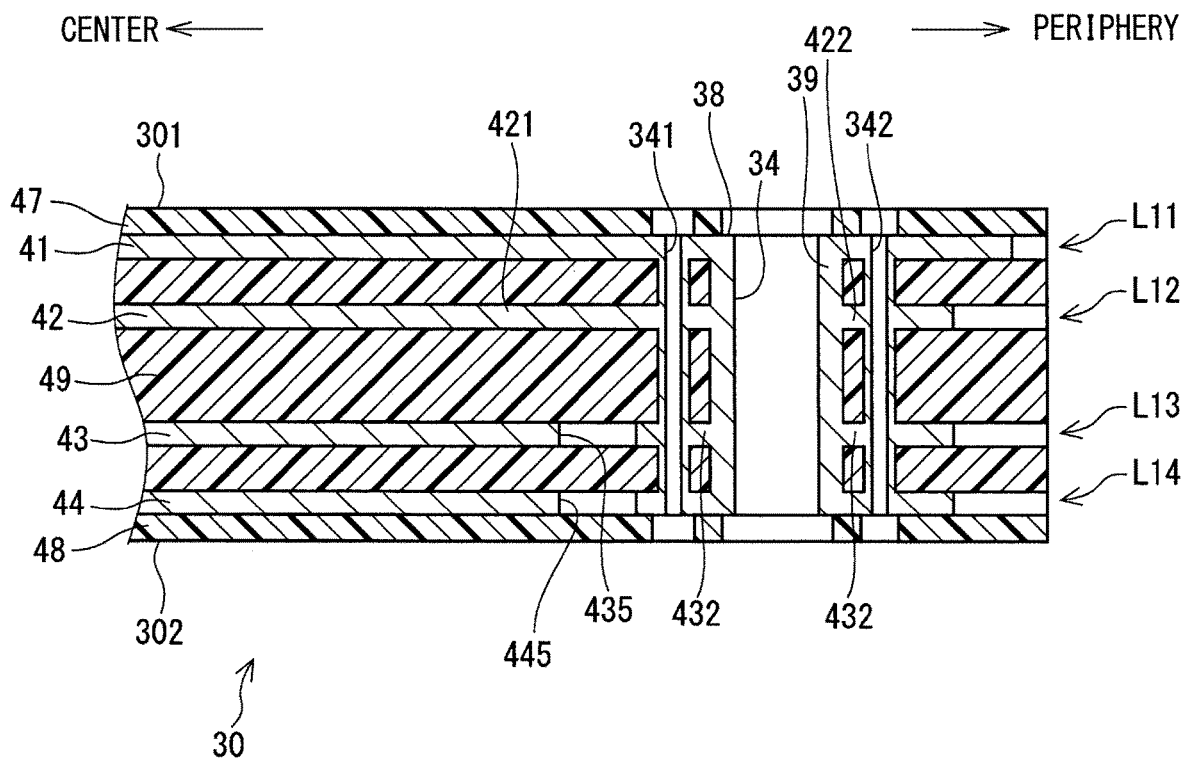
FIG. 8 illustrates a cross-sectional view of a substrate in a second embodiment of the present disclosure.
Figure 9:
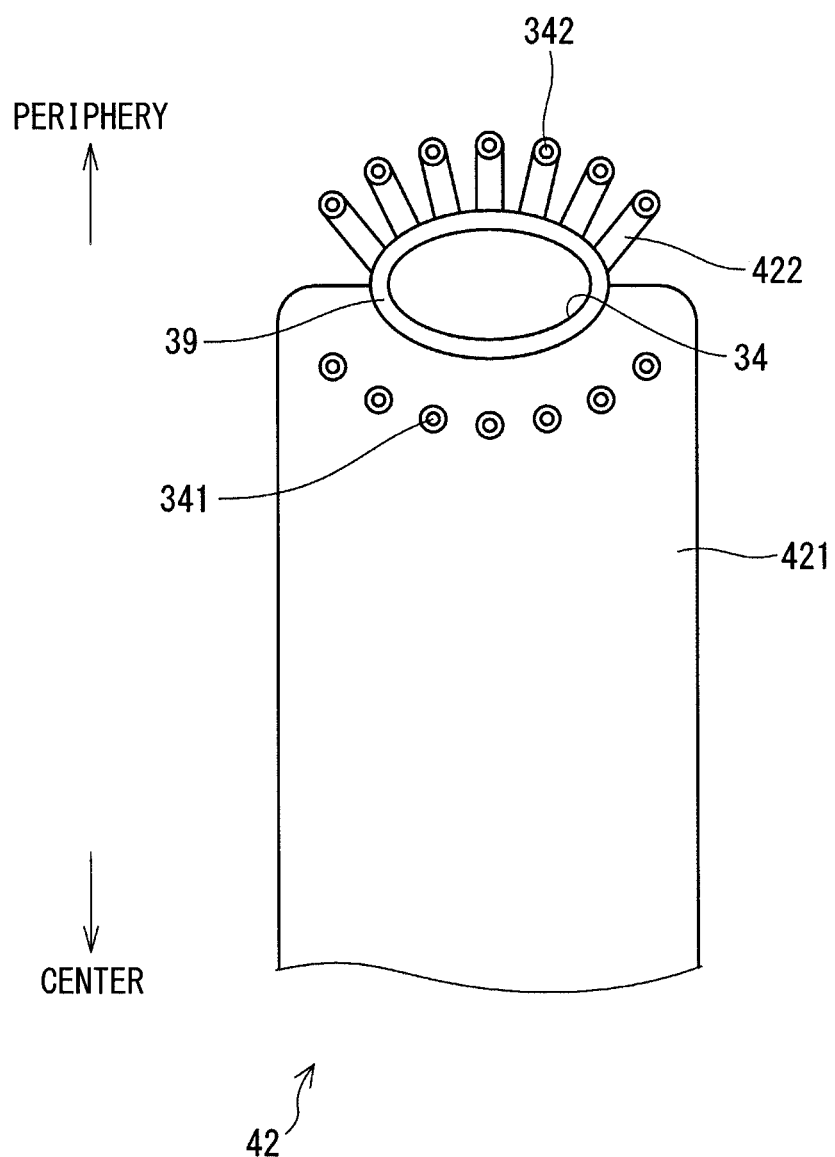
FIG. 9 illustrates a schematic view of a second circuit pattern in the second embodiment.

The cross section of the substrate 30 shown in FIG. 8 is similar to the cross section of the first embodiment described with reference to FIG. 7. FIG. 9 illustrates the circuit pattern 42 of the second layer L12. FIG. 10 illustrates the circuit pattern 43 of the third layer L13, both showing a circuit pattern around/near the ground terminal connection portion 34. In both of FIGS. 9 and 10, the upper side of the drawing corresponds to an orientation toward the periphery of the substrate 30 and the lower side of the drawing corresponds to an orientation toward the center of the substrate 30. In the present embodiment, the circuit pattern of the first layer L11 is the same as in the first embodiment, for example, as described with reference to FIG. 5. The circuit pattern 44 of the fourth layer L14 is the same as the circuit pattern 43 of the third layer L13.

In some instances, the inner via 341 may be connected to a ground pattern 421 on the center side of the second layer L12 for product performance. In such an example, the separator 425 cannot be formed on the second layer L12. When the inner via 341 is not provided, the heat received from the first surface 301 is transferred to the second surface 302 during soldering only by way of the ground terminal connection portion 34 and the outer via 342. In this case, the heat may be dissipated mainly from the ground terminal connection portion 34 to the inner layer pattern, and the amount of heat dissipated to the second surface 302 may be reduced. That is, the heat transferred from the first surface 301 to the second surface 302 may not sufficient to ensure a good soldering operation.

In the present embodiment, the inner via 341 facilitates a transfer of heat from the first surface 301 to the second surface 302, while also serving as a barrier to suppress heat dissipation to the circuit patterns connected toward the center of the substrate 30. In the second circuit pattern 42 of the second layer L12, when the ground pattern 421 extending toward the center of the substrate 30 is connected with the ground terminal connection portion 34, as shown in FIG. 9, the number of connections between the vias and the ground pattern 421 is restricted to a minimum, so as to limit the number of possible heat dissipation paths to the surrounding patterns. In the example of FIG. 9, the ground pattern 421 is connected to the inner via 341, but is not connected to the outer via 342. In the example of FIG. 9, seven inner vias 341 are formed, all of which are connected to the pattern 421. However, to minimize the number of heat dissipation paths as described above, only five of the inner vias 341 may be connected to the pattern 421, with two of the inner vias 341 not connected to the pattern 421.

On the second layer L12, the outer via 342 and the ground terminal connection portion 34 are connected by an auxiliary pattern 422. The auxiliary pattern 422 is a relatively narrow circuit pattern having a width substantially equal to an outer diameter of the outer via 342. Not connecting the outer via 342 to the other circuit patterns (i.e., patterns other than the auxiliary pattern 422) to limit the heat dissipation to the other circuit patterns better facilitates heat dissipation to the second surface 302. A resist layer is formed on the auxiliary pattern 422 to limit and/or prevent any expansions of the through hole land 39.

Figure 10:
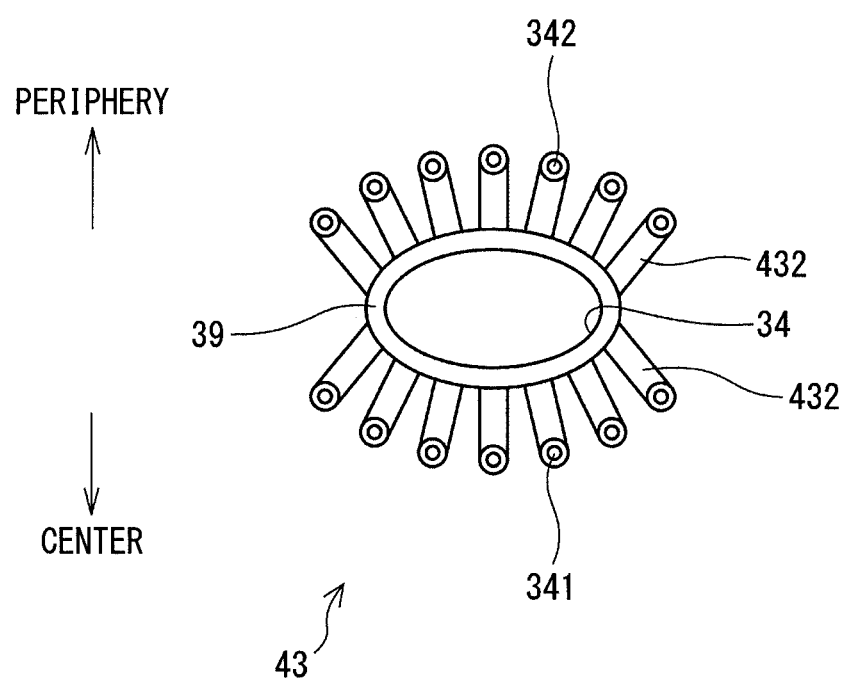
FIG. 10 illustrates a schematic view of a third circuit pattern in the second embodiment.

With reference to FIGS. 8 and 10, on the third layer L13, the circuit pattern is not connected around the ground terminal connection portion 34. As such, the inner vias 341 and the outer vias 342 are both connected to the ground terminal connection portion 34 by the auxiliary patterns 432. Not connecting the inner vias 341 and outer vias 342 to the other circuit patterns (i.e., patterns other than the auxiliary pattern 432 to limit the heat dissipation to the other circuit patterns better maintain the heat around the terminal connection portions (e.g., the ground terminal connection portion 34) and better facilitates heat dissipation from the first surface 301 to the second surface 302. The same principle applies to the fourth layer L14.

Depending on the amount of power supplied to the substrate 30, there may be only one circuit pattern (e.g., a power supply pattern) on a single layer connected to the power terminal connection portion 33. In such a case, the inner via and the outer via may be connected to the terminal connection portion by an auxiliary pattern, similar to the arrangement shown in FIG. 10.

On the third layer L13 and the fourth layer L14, the vias 341 and 342 are connected to the ground terminal connection portion 34 by the auxiliary pattern 432 included for each via. On the second layer L12, the inner via 341 is included in the pattern 421 extending from the ground terminal connection portion 34 toward the center of the substrate 30, and the outer via 342 is connected to the ground terminal connection portion 34 by the auxiliary pattern 422 provided for each via.

When a connection between the ground terminal connection portion 34 and the pattern 421 extending toward the center of the substrate 30 is provided for product performance, the connection between the connection portion 34 and the pattern 421 is provided by a minimum number of connections, and/or by other auxiliary connections by using relatively narrow/thin auxiliary patterns 422 and 432. By limiting the connection of the vias 341 and 342 to the pattern extending toward the center of the substrate 30 as much as possible, the heat transfer toward the second surface 302 is better facilitated while suppressing heat dissipation to other circuit patterns. By including the inner vias 341 in the ground pattern 421, the inner vias 341 function as a heat dissipation barrier, to reduce the heat dissipated radially toward the center of the substrate 30, as compared to designs that do not include the via 341 in the ground pattern 421. In the present embodiment, the same advantageous effects achieved by the first embodiment can also be achieved by the configurations in the second embodiment.

Third Embodiment

The third embodiment of the present disclosure is described with reference to FIGS. 11, 12, and 13. A substrate 50 in the present embodiment is a six layer substrate with build-up layers (e.g., a laminated substrate).

Figure 13:
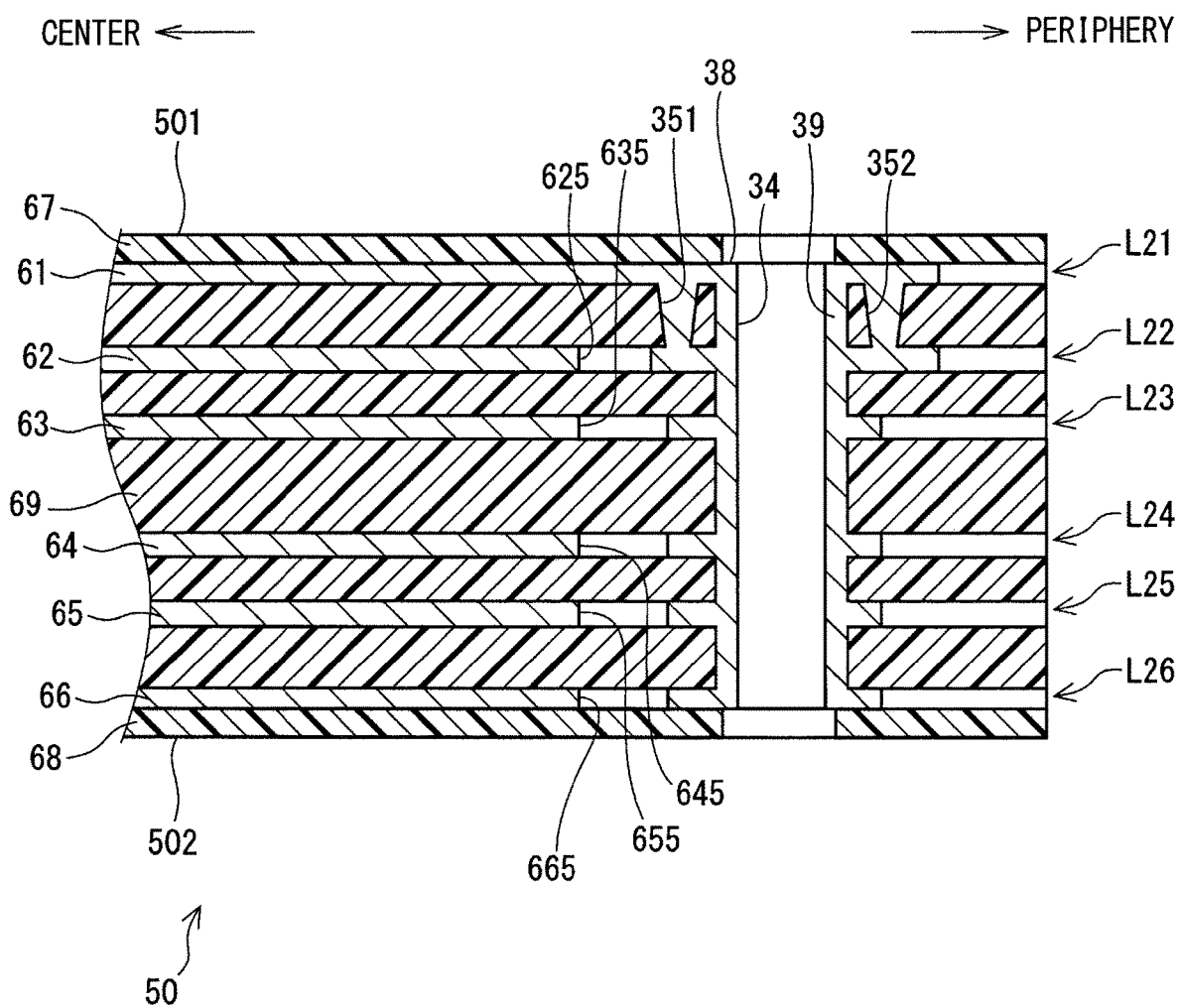
FIG. 13 illustrates a cross-sectional view of a substrate and the ground terminal connection portion taken along line XIII-XIII in FIG. 11.

With reference to FIG. 13, one of the two main surfaces of the substrate 50 is a first surface 501, and the other main surface is a second surface 502. From the first surface 501 side, the substrate includes a first layer L21, a second layer L22, a third layer L23, a fourth layer L24, a fifth layer L25, and a sixth layer L26. A first circuit pattern 61 is included in the first layer L21, a second circuit pattern 62 is included in the second layer L22, a third circuit pattern 63 is included in the third layer L23, and a fourth circuit pattern 64 is included in the fourth layer L24. A fifth circuit pattern 65 is included in the layer L25, and a sixth circuit pattern 66 is included in the sixth layer L26. An interlayer insulating layer 69 is formed between the circuit patterns 61, 62, 63, 64, 65, and 66 (i.e., 61-66). A surface resist layer 67 is formed on the first surface 501, and a surface resist layer 68 is formed on the second surface 502.

Figure 11:
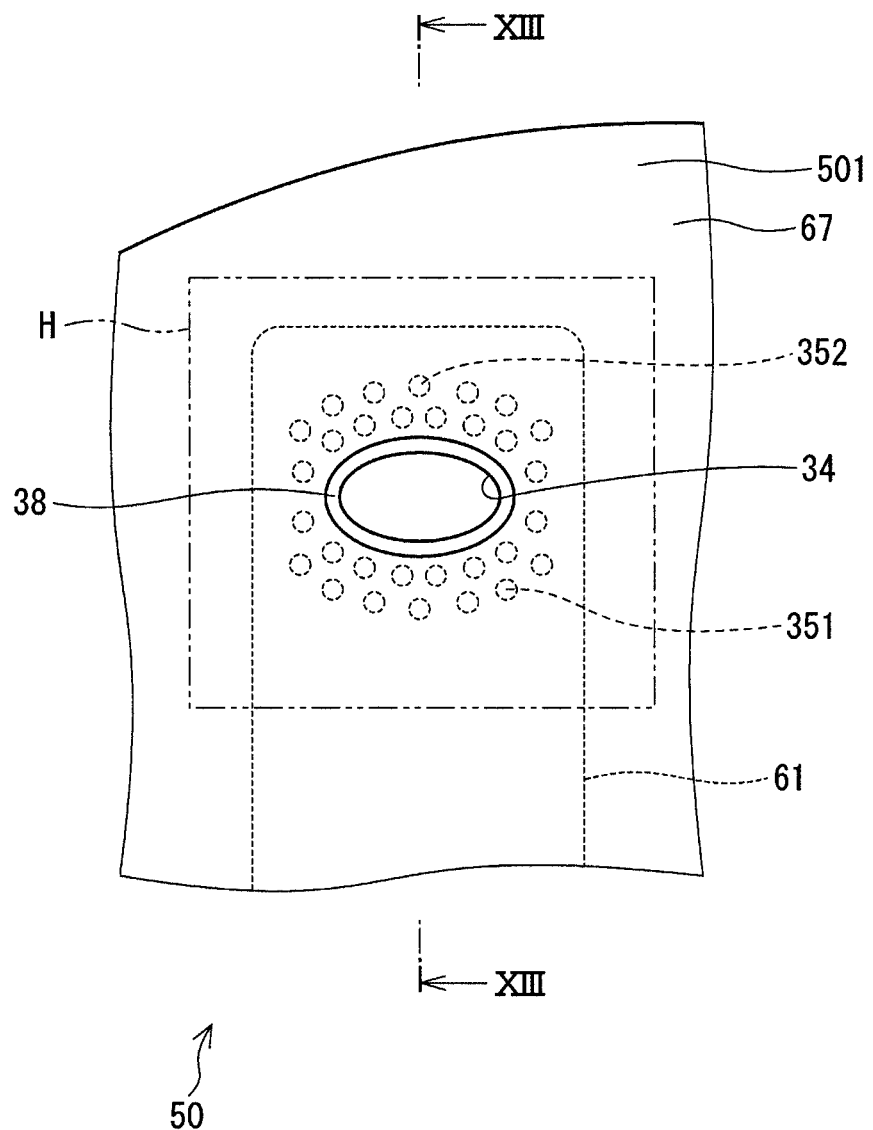
FIG. 11 illustrates a plan view of the ground terminal connection portion in a third embodiment of the present disclosure.

With reference to FIG. 11, similar to the first embodiment, the circuit pattern 61 is near the first surface 501 side of the substrate 50. The description of the present embodiment assumes that the first surface 501 is the soldering surface, that is, the surface on which a soldering operation is performed to solder a component to the substrate 50. The circuit pattern 61 is wide to spread across a larger area in order to better receive the heat from soldering.

As shown in FIG. 11, when viewed from the first surface 501 side, vias 351 and 352 are formed so as to surround the ground terminal connection portion 34. On the substrate 50, inner vias 351 are formed on the center side of the ground terminal connection portion 34 (i.e., the side oriented toward the center of the substrate 50), and outer vias 352 are formed on the periphery side of the ground terminal connection portion 34. In the present embodiment, the vias 351 and 352 are arranged concentrically in two sets of elliptical shapes around the ground terminal connection portion 34. The vias 351 and 352 in the present embodiment are laser vias and connect the circuit pattern 61 of the first layer L21 with the circuit pattern 62 of the second layer L22, as shown in FIG. 13. The insides of the vias 351 and 352 are filled with a conductor such as copper. Filling the vias 351 and 352 with a conductive material allows the vias 351 and 352 to handle larger current loads compared to cases where the via is provided only as a through hole. To distinguish the vias 351 and 352 from the plurality of other vias, e.g., the through hole vias 341 and 342, the vias 351 and 352 may be referred to as front side vias 351 and 352 because they are disposed on the side of the substrate 50 opposite of the back side vias described in latter embodiments.

Figure 12:
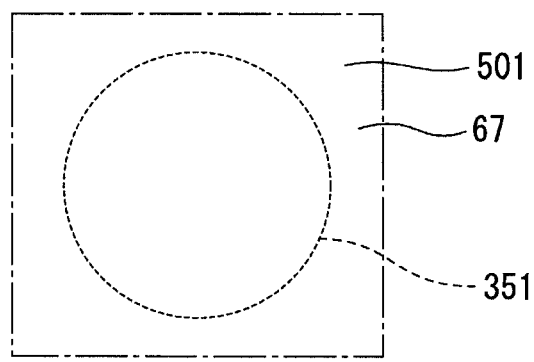
FIG. 12 illustrates a plan view of a via in the third embodiment.

FIG. 12 illustrates one inner via 351. As shown in FIG. 12, since there is no hole in the via 351, the portion where the via 351 is formed is covered with the surface resist layer 67 and the surface resist layer 67 has no opening at a position above the via 351. As such, the heat receiving area H is covered by the surface resist layer 67, except for the resist openings 37 and 38 formed at the outer edges of the terminal connection portions 33 and 34. Configuring the vias 351 and 352 in this matter limits and/or eliminates the generation of foreign materials and defects, such as a solder balls.

As shown in FIG. 13, since the vias 351 and 352, which are laser vias, are filled with a heat conductive material (i.e., conductor) inside the via, more heat energy is transferable to the inner layer(s). The vias 351 and 352 facilitate heat dissipation from the first surface 501 side to the second surface 502 side, similar to the vias 341 and 342 in the previous embodiments. Similarly, the inner vias 351 also functions as a barrier to limit and/or prevent the spread of heat toward the center of the substrate 50. As such, the inner vias 351 also function to maintain heat around the connection portion 34 on the center side of the connection portion 34.

The circuit patterns 63, 64, 65, and 66 (i.e., 63-66) are formed to be smaller than the circuit patterns 61 and 62 in the periphery-side region of the outer vias 352. By making the circuit patterns 63-66 on the third layer L23 to the sixth layer L26 as small as possible on the periphery side of the vias 352, heat is limited and/or prevented from escaping toward the periphery of the substrate 50. As such, heat can be better maintained around the connection portion 34 on the center side of the connection portion 34.

The circuit patterns 62-66 of the layers other than the first layer L21, which are positioned on the center side of the inner via 351 toward the center of the substrate 50, include separators 625, 635, 645, 655, and 665 to separate the respective circuit patterns extending toward the center of the substrate 50 from the circuit pattern connected to the ground terminal connection portion 34. Such separators 625, 635, 645, 655, and 665 are formed on the center side of the inner vias 351 (i.e., the separators are disposed more toward the center of the substrate 50 than the front side inner vias 351. The separators 625, 635, 645, 655, and 665, limit and/or prevent heat from dissipating toward the center of the substrate 30 to better maintain heat around the connection portion 34.

The vias 351 and 352 connect the first circuit pattern 61 on the first layer L21 to the second circuit pattern 62 on the second layer L22, and the inside of each of the vias 351 and 352 is filled with a conductive material. The first surface 501 of the substrate 50 is covered with the surface resist layer 67. In the present embodiment, the vias 351 and 352 are laser vias. As such, when the substrate 50 and the terminals 463 and 464 are connected by a soldering process, the generation of solder balls can be reduced and/or eliminated. Since the insides of the vias 351 and 352 are filled with a conductor, the vias 351 and 352 can be used with high currents. The present embodiment can also achieve the same advantageous effects as those achieved by the previous embodiments.

Fourth Embodiment

Figure 14:
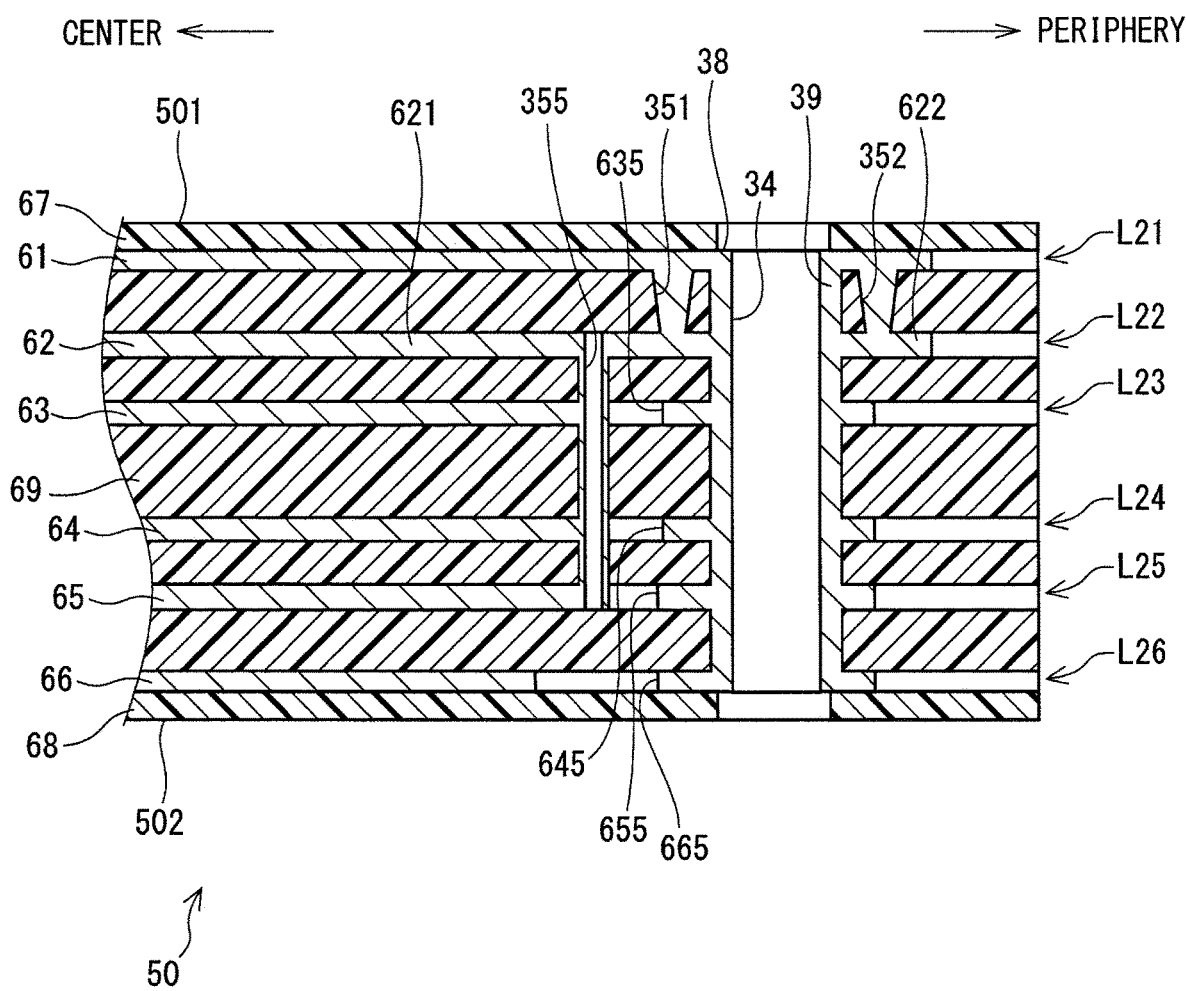
FIG. 14 illustrates a cross-sectional view of a substrate in a fourth embodiment of the present disclosure.
Figure 15:
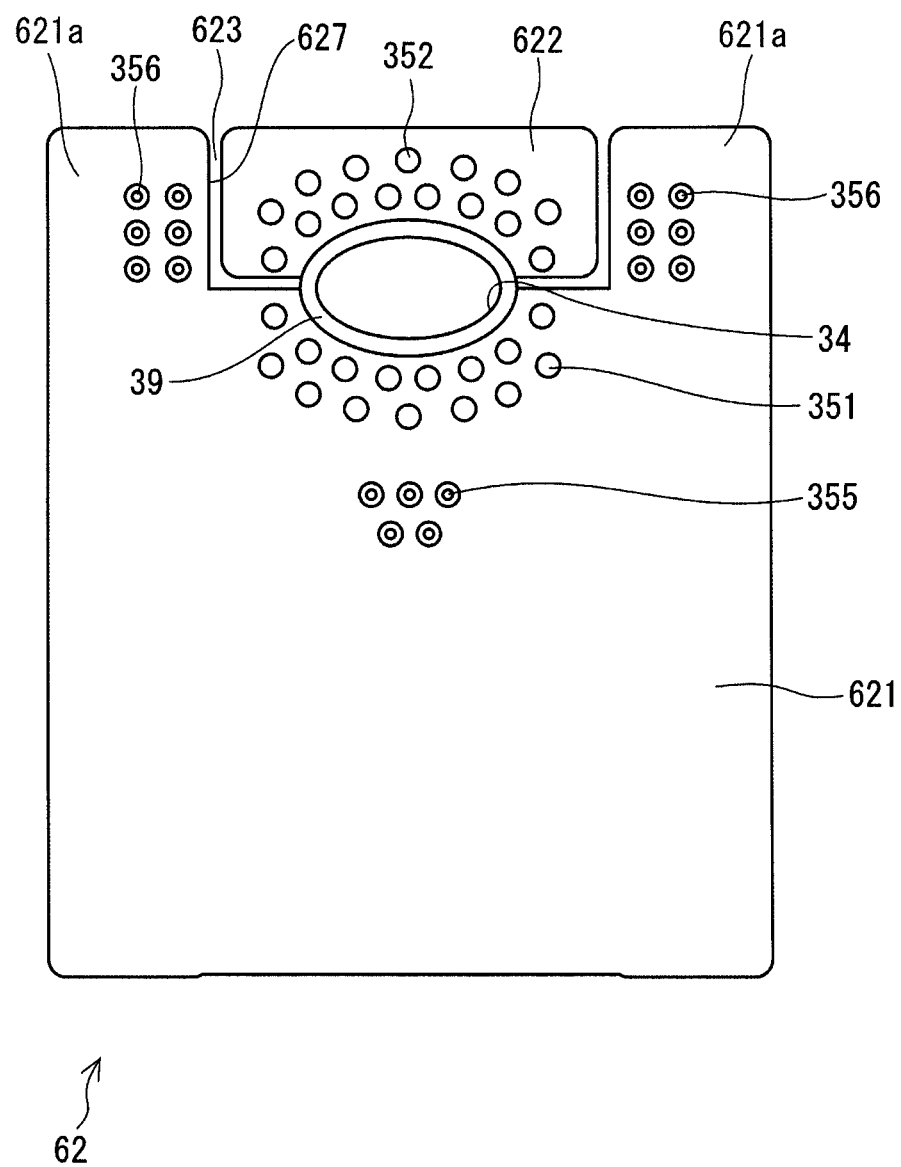
FIG. 15 illustrates a schematic view of a second circuit pattern in the fourth embodiment.
Figure 16:
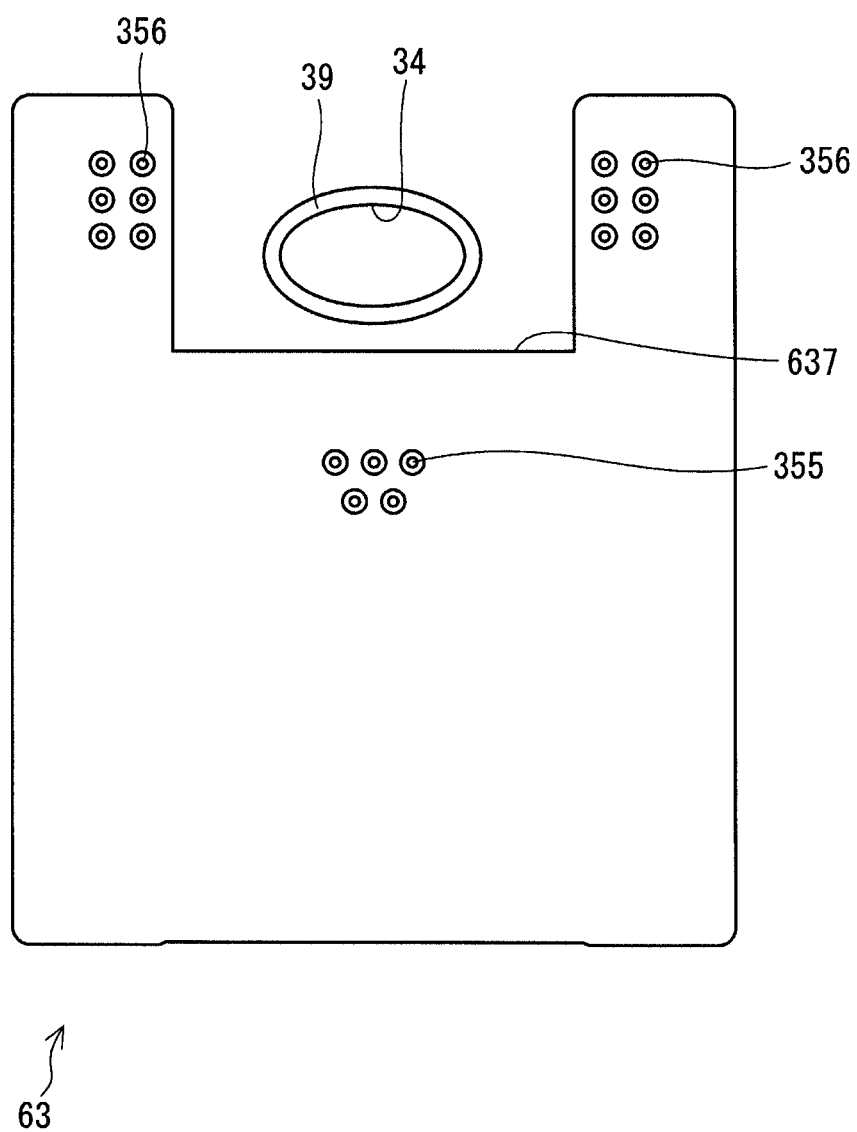
FIG. 16 illustrates a schematic view of a third circuit pattern in the fourth embodiment.

A fourth embodiment is described with reference to FIGS. 14-17. In the present embodiment, the circuit patterns 62-66 on the second to sixth layers L22-L26 are mainly described. The substrate illustrated in FIG. 14 is similar to the substrate 50 in FIG. 13 of the third embodiment. FIG. 15 illustrates the circuit pattern 62 of the second layer L22, and FIG. 16 illustrates the circuit pattern 63 of the third layer L23, with both FIGS. 15 and 16 showing a circuit pattern around the ground terminal connection portion 34. The circuit pattern 61 of the first layer L21 is assumed to be the same as the first layer L21 of the third embodiment and described with reference to FIG. 11, and the circuit patterns 64 and 65 of the fourth layer L24 and the fifth layer L25, respectively, are assumed to be the same as the circuit pattern 63 of the third layer L23.

As previously described in the second embodiment, the separator 625 cannot be formed when it is necessary to connect the inner via 351 and the inner circuit pattern 621 on the center side of the second layer L22 for product performance, for example, as a ground pattern.

In the present embodiment, as shown in FIGS. 14 and 15, the circuit pattern 62 of the second layer L22 includes an inner circuit pattern 621 in which the inner via 351 is formed, and an outer circuit pattern 622 in which the outer via 352 is formed. As shown in FIG. 15, the inner circuit pattern 621 includes a recess 627 having opening on the periphery, and the outer circuit pattern 622 is positioned in the recess 627. The through hole land 39 is used to connect the patterns 621 and 622. A separation gap 623 is formed between the inner pattern 621 and the outer pattern 622, and the inner pattern 621 and the outer pattern 622 are separated from each other by a certain gap distance, except for the portions of the patterns 621 and 622 connected by the through hole land 39. By using such a configuration, the heat dissipation from the outer pattern 622 to the inner pattern 621 can be reduced and/or eliminated (i.e., suppressed). The outer pattern 622 helps to transfer the heat received by the first layer L21 to the ground terminal connection portion 34.

As shown in FIG. 15, two extension portions 621a of the inner circuit pattern 621 are formed to extend to the periphery of the substrate 50 on both sides of the outer pattern 622. The extension portions 621a are separated from the outer circuit pattern 622 by the separation gap 623. In the inner circuit pattern 621, the middle layer vias 355 and 356 are formed to connect the circuit patterns 62-65 on the second L22 to fifth L25 layers. The middle layer vias 355 and 356 are separate from the vias 351 and 352 (e.g., front side vias 351 and 352) that connect the first layer L21 and the second layer L22.

The middle layer vias 355 are formed in a region on the center side of the inner vias 351 (i.e., more toward the center of the substrate 59 than the inner vias 351), and the middle layer vias 356 are formed in a region of the extension portions 621a of the inner circuit pattern 621 and are disposed adjacent to the separation gap 623 and across from the outer circuit pattern 622 so as to face the outer circuit pattern 622. By arranging the middle layer vias 355 and 356 separately from the ground terminal connection portion 34 and the vias 351 and 352 that are connected to the ground terminal connection portion 34, heat can be transferred to the ground terminal connection portion 34 by the vias 351 and 352, while the middle layer vias 355 and 356 function as a barrier to limit and/or prevent heat dissipation to the circuit patterns 63-65 of the third to fifth layers L23-L25.

As shown in FIG. 16, the circuit pattern 63 of the third layer L23 has a recess 637 (e.g., absence of circuit pattern 63) surrounding the ground terminal connection portion 34 with the through hole land 39 formed in the recess 637. The ground terminal connection portion 34 and the through hole land 39 are separated from the circuit pattern 63 by the recess 637 by a certain gap length. In the circuit pattern 63, the vias 351 and 352 are not formed, but the middle layer vias 355 and 356 are formed instead. The circuit patterns 64 and 65 respectively on the fourth and fifth layers L24 and L25 are configured the same as the circuit pattern 63.

Figure 17:
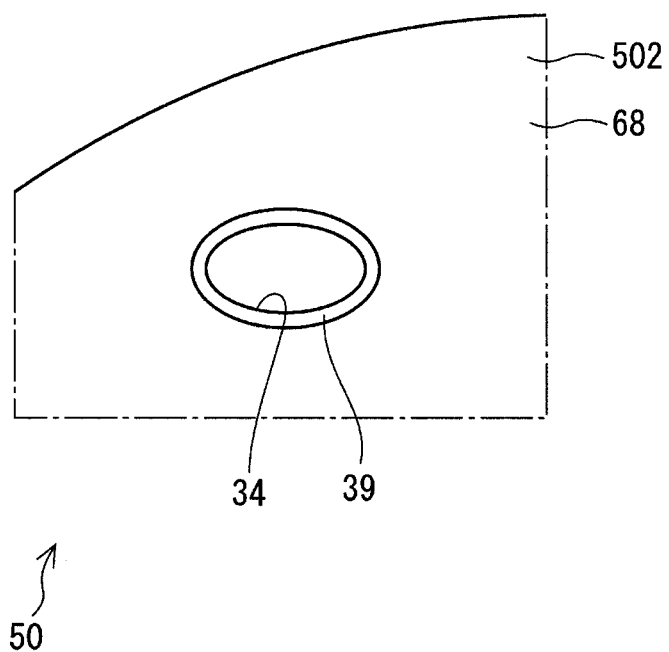
FIG. 17 illustrates a view of a second surface side of a ground terminal connection portion in the fourth embodiment.

With reference to FIG. 17, on the sixth layer L26, the through hole land 39 formed in the ground terminal connection portion 34 is not connected to another pattern. As such, such an arrangement suppresses heat dissipation to the other patterns.

In the present embodiment, the substrate 50 has the middle layer vias 355 and 356 formed therein that pierce middle circuit patterns 62-65 on the middle inner layers. In this case, the middle inner layers are the layers that include circuit patterns other than the first circuit pattern 61 and the sixth circuit pattern 66 (i.e., the last or n-th circuit pattern). The middle inner layers may be the layers in the substrate that are not adjacent to the first surface 501 and the second surface 502 (e.g., L21 and L26). While the present embodiment has six layers, the middle layer vias 355 and 356 may be formed in any number of middle inner layers, so long as the substrate 50 has 4 or more layers. In the present embodiment, the circuit patterns 62-65 may be referred to as a "middle circuit pattern." As such, the middle circuit patterns may be used to reduce and/or eliminate (i.e., suppress) the heat dissipation from the ground terminal connection portion 34 to the circuit patterns 62-66.

The middle layer vias 355 and 356 are formed at different positions away from the positions of the vias 351 and 352. That is, the middle layer vias 355 and 356 are formed at positions that are offset from positions of the inner vias 351 and outer vias 352 so that the inner vias 351 and outer vias 352 do not overlap/overlie the middle layer vias 355 and 356. The middle layer vias 355 are formed at positions closer to the center of the substrate 50 than the ground terminal connection portion 34 and the inner vias 351. As such, the positioning of the middle layer vias 355 can better limit and/or prevent heat from being radially dissipated toward the circuit patterns around the center of the substrate 50.

The second circuit pattern 62 includes the outer pattern 622 connecting the outer via 352 and the ground terminal connection portion 34, and the inner pattern 621 extending toward the center of the substrate 50. The inner pattern 621 is formed to extend on both sides of the outer pattern 622. The middle layer vias 356 in the inner pattern 621 are formed on both sides of the outer pattern 622 so as to face the outer pattern 622. By using such a configuration, the size of the inner pattern 621 can be maintained while limiting the heat that is dissipated from the outer pattern 622 to the inner pattern 621. The present embodiment can achieve the same advantageous effect as those described in the previous embodiments.

Fifth Embodiment

Figure 18:
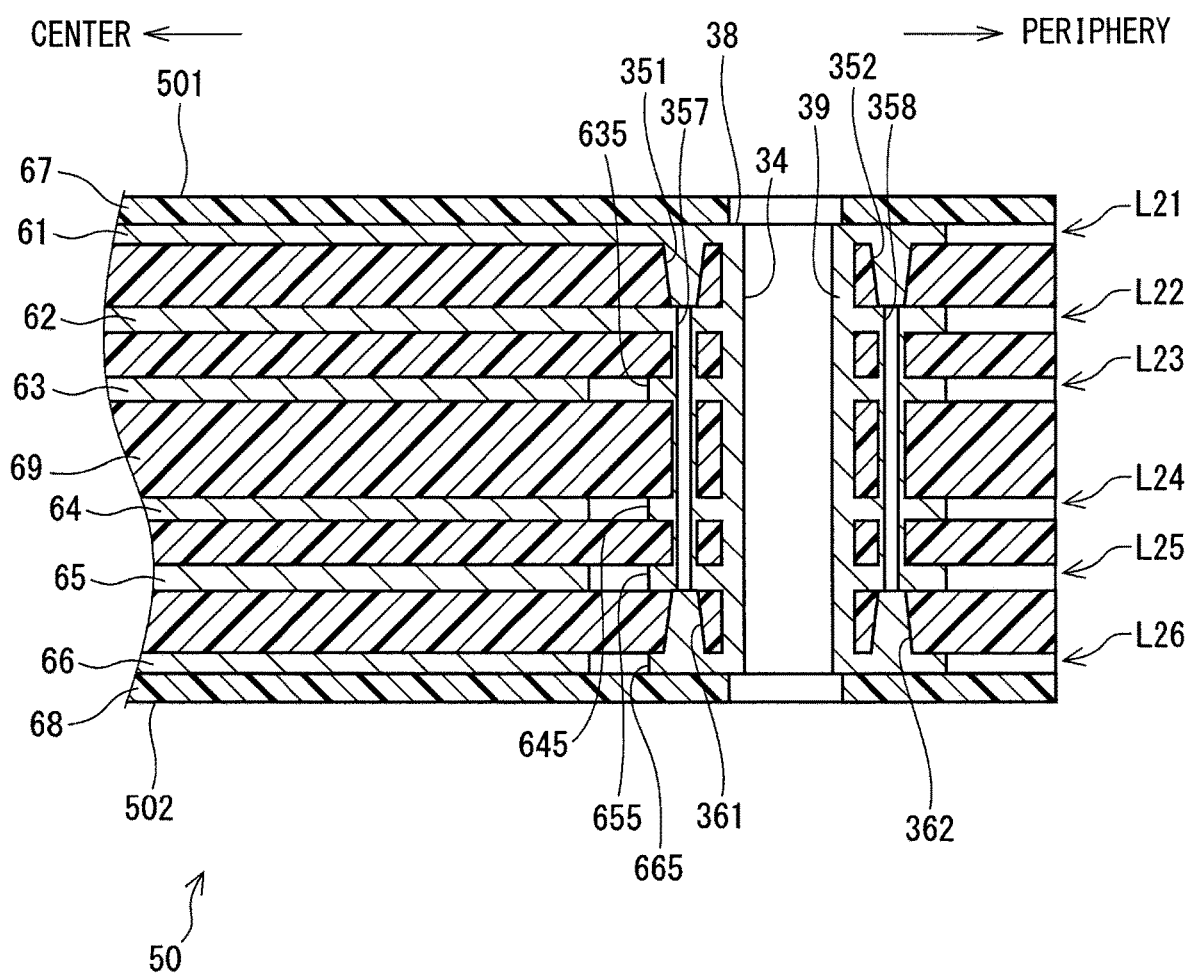
FIG. 18 illustrates a cross-sectional view of a substrate in a fifth embodiment of the present disclosure.

The fifth embodiment is described with reference to FIG. 18. In the present embodiment, a middle layer via 357 on the center side of the terminal connection portion 34 and a middle layer via 358 on the periphery side of the terminal connection portion 34 are formed in the substrate 50. The middle layer via 357 is formed immediately below the inner front side via 351 and the middle layer via 358 is formed immediately below the outer front side via 352.

The substrate 50 also includes back side vias 361 and 362 formed to connect the circuit pattern 66 of the sixth layer L26 and the circuit pattern 65 of the fifth layer L25. The back side vias 361 and 362 are laser vias, and the insides of the vias 361 and 362 are filled with a conductive material (i.e., conductor) such as copper. The second surface 502 sides of the vias 361 and 362 are covered with the surface resist layer 68. In the present embodiment, the back side vias 361 and 362 are aligned with the front side vias 351 and 352 and disposed immediately below the middle layer vias 357 and 358, as shown in FIG. 18. However, the back side vias 361 and 362 are not limited to such a position and may be positioned elsewhere in the substrate 50.

In the present embodiment, the middle layer via 357 is formed immediately below the inner front side via 351, and the middle layer via 358 is formed immediately below the outer front side via 352. Such a configuration better facilitates heat dissipation to the second surface 502.

In the present embodiment, the substrate 50 has "n" layers, where n is an integer of 3 or more. In contrast to a first layer, an n-th layer may indicate the last layer in layered substrate 50. In the present embodiment, the substrate 50 has, for example, 6 layers (i.e., n=6). As such, in this example the sixth layer may be referred to as the n-th layer. The substrate 50 is provided with the back side vias 361 and 362 that connect the sixth circuit pattern 66 on the sixth layer L26 to the fifth circuit pattern 65 on the fifth layer L25, where the back side vias 361 and 362 are filled with conductive material. In this example, the sixth layer L26 is considered to be immediately adjacent to the fifth layer L25, such that if the sixth layer were referred to as, for example, the n-th layer, the immediately adjacent layer to the n-th layer would be the next adjacent layer in the layered substrate. When the back side vias 361 and 362 are formed, n is an integer of 3 or more. Such a configuration with the back side vias 361 and 362 facilitates the production of solder fillets during the soldering operations. The present embodiment can achieve the same advantageous effects as those described in the previous embodiments.

Other Embodiments

The first and second embodiments describe four layers substrates with through holes. The third to fifth embodiments describe six layer substrates with build-up layers. However, the types of substrates and number of layers are not limited to the examples in the above-described embodiments. For example, the number of layers may be three, five, seven, or more. The type of substrate may also be different. The number and the arrangement of the through hole vias, the front side vias, the middle layer vias, and a back side vias may be appropriately set based on manufacturing and assembly considerations (e.g., based on the degree or state of solder rise), and the inner vias may be omitted.

In the above-described embodiments, the power supply terminal and the ground terminal are inserted into the substrate from the surface opposite to the motor (i.e., the cover facing surface), and soldering is performed on the motor side surface. In other embodiments, a connector may be provided between the substrate and the motor, and the power supply terminal and the ground terminal may be inserted into the terminal connection portion from the motor side. In such a case, since the soldering is performed on the cover facing surface of the substrate, the above-described embodiments may be applied in a similar manner, assuming that the first surface described in the embodiments above would be the second surface in this case. As such, the teaching in the above-described embodiments may be adapted to accommodate instances where the soldering is performed on the cover facing surface of the substrate.

In the above embodiments, the outermost terminals are the power supply terminal and the ground terminal. In other embodiments, the lead wire connecting the motor winding and the substrate may be considered as the "outermost terminal," the motor wire connection portion may be considered as the "terminal connection portion," and the vias may be disposed at positions close to the motor wire connection portion. The middle layer vias and the back surface vias may also be included in such an embodiment. In the above-described embodiments, the terminal connection portion is formed in an oval/elliptical shape. In other embodiments, the terminal connection portion may have a shape other than an oval shape, such as a circular shape or a rectangular shape.

In the above-described embodiments, the motor is a three-phase brushless motor. In other embodiments, the motor is not limited to a three-phase brushless motor and could be any motor. The motor unit is not limited to an electric motor, but may be a generator, or may be a motor-generator that functions both as an electric motor and as a generator.

In the above-described embodiments, the electronic control unit (ECU) is applied to an electric power steering device. In other embodiments, the ECU may be applied to devices other than the electric power steering device. As described above, the ECU of the present disclosure is not limited to the above-described embodiments and can be implemented in various forms without departing from the spirit and scope of the present disclosure.

What is claimed is:

1. An electronic control unit comprising:
   a substrate including:
      a first surface;
      a second surface disposed opposite the first surface;
      a plurality of circuit patterns arranged in layers between the first surface and the second surface and layered from a first layer to an n-th layer, where n is an integer of 2 or more;
      a surface resist layer disposed on the first layer;
      a terminal connection portion provided as a through hole that pierces the first surface, extends through the substrate, and pierces the second surface, the terminal connection portion disposed at an outermost position near a periphery of the substrate;
      a resist opening that exposes a first circuit pattern of the first layer along an outer edge of the terminal connection portion; and
      a plurality of vias disposed at positions adjacent to the resist opening, and an outermost terminal positioned in the terminal connection portion and connected to the terminal connection portion with a connection member, wherein the first surface is a main surface of the substrate near the first layer and the second surface is another main surface of the substrate near the n-th layer, and the plurality of vias include a plurality of outer vias formed in a heat receiving area and on a periphery side of the substrate between the resist opening and the periphery of the substrate, the heat receiving area configured to receive heat from the connection member during a connection process when the outermost terminal is inserted into the terminal connection portion and is connected to the outermost terminal by the connection member, and the surface resist layer is disposed continuously between the resist opening and the plurality of vias.

2. The electronic control unit of claim 1, wherein
the plurality of vias further includes a plurality of inner vias formed in the heat receiving area and on an inner side of the substrate between the resist opening and a center of the substrate, wherein the inner side of the substrate is opposite to the periphery side with respect to the resist opening.

3. The electronic control unit of claim 2, wherein
the plurality of vias include a plurality of front side vias that connect the first circuit pattern of the first layer and a second circuit pattern of a second layer, wherein an inside of each of the front side vias is filled with a conductive material, and wherein the first surface of the substrate is covered with the surface resist layer.

4. The electronic control unit of claim 3, wherein
the plurality of vias further includes a plurality of middle layer vias formed in inner layers of the substrate, the inner layers of the substrate disposed between the first layer and the n-th layer, where n is an integer of 4 or more, and wherein each of the plurality of middle layer vias pierces and extends through middle circuit patterns disposed on the inner layers.

5. The electronic control unit of claim 4, wherein
the middle layer vias are formed at positions that are offset from positions of the inner vias so that inner front side vias do not overlap the middle layer vias.

6. The electronic control unit of claim 5, wherein
the middle layer vias are formed at positions closer to the center of the substrate than the terminal connection portion and the inner vias.

7. The electronic control unit of claim 5, wherein
the second circuit pattern includes
an outer circuit pattern configured to connect outer front side vias to the terminal connection portion; and
an inner circuit pattern that extends inwardly toward the center of the substrate, wherein
a separation gap is disposed between the inner circuit pattern and the outer circuit pattern to separate the inner circuit pattern from the outer circuit pattern, and wherein
the inner circuit pattern includes two extension portions that extend to the periphery of the substrate so that each of the extension portions extends on a side of the outer circuit pattern with each of the extension portions separated from the side of the outer circuit pattern by the separation gap, each of the extension portions including a plurality of middle layer vias formed therein that are disposed adjacent to the separation gap and across from the outer circuit pattern.

8. The electronic control unit of claim 4, wherein
the middle layer vias are formed immediately below the front side vias.

9. The electronic control unit of claim 3, wherein
the plurality of vias includes a plurality of back side vias formed in the substrate for connecting an n-th circuit pattern of the n-th layer to a circuit pattern on a layer immediately adjacent to the n-th layer, each of the plurality of back side vias filled with a conductive material.

10. The electronic control unit of claim 2, wherein
a distance between outermost vias of the plurality of inner vias and corresponding outermost vias of the plurality of outer vias across the terminal connection portion is greater than a distance between individual vias of the plurality of inner vias and the plurality of outer vias.

11. The electronic control unit of claim 1, wherein
the vias are through hole vias that penetrate the first surface, extend through the substrate, and penetrate the second surface, and wherein
the surface resist layer is formed at a position between the vias and the resist openings on the first surface.

12. The electronic control unit of claim 11, wherein
each of the vias is connected to the terminal connection portion by an auxiliary pattern provided for each via.

13. The electronic control unit of claim 11, wherein
the vias disposed on a center side of the terminal connection portion are provided in a ground circuit pattern extending from the terminal connection portion toward the center of the substrate, and the vias disposed on a periphery side of the terminal connection portion are connected to the terminal connection portion by an auxiliary pattern provided for each of the vias disposed on the periphery side of the terminal connection portion.

14. The electronic control unit of claim 1, wherein
the circuit patterns formed on a center side of the terminal connection portion on the layers except for the first layer in the substrate include a separator configured to separate a circuit pattern connected to the terminal connection portion from the circuit patterns formed on the center side of the terminal connection portion that extend toward the center of the substrate.

15. The electronic control unit of claim 1, wherein
the outermost terminal is
 (i) a power supply terminal configured to connect to a power supply, or
 (ii) a ground terminal configured to connect to a ground.

16. An electric power steering device comprising:
a speed reduction gear; and
a drive device including
 a motor, and
 an electronic control unit comprising:
  a substrate including:
   a first surface;
   a second surface disposed opposite the first surface;
   a plurality of circuit patterns arranged in layers between the first surface and the second surface and layered from a first layer to an n-th layer, where n is an integer of 2 or more;
   a surface resist layer disposed on the first layer;
   a terminal connection portion provided as a through hole that pierces the first surface, extends through the substrate, and pierces the second surface, the terminal connection portion disposed at an outermost position near a periphery of the substrate;

a resist opening that exposes a first circuit pattern of the first layer along an outer edge of the terminal connection portion; and a plurality of vias disposed at positions adjacent to the resist opening, and an outermost terminal positioned in the terminal connection portion and connected to the outermost terminal with a connection member, wherein the first surface is a main surface of the substrate near the first layer and the second surface is another main surface of the substrate near the n-th layer, and the plurality of vias include a plurality of outer vias formed in a heat receiving area and on a periphery side of the substrate between the resist opening and the periphery of the substrate, the heat receiving area configured to receive heat from the connection member during a connection process when the outermost terminal is inserted into the terminal connection portion and is connected to the outermost terminal by the connection member, and the surface resist layer is disposed continuously between the resist opening and the plurality of vias.

\* \* \* \* \*